(12) United States Patent
Chew et al.

(10) Patent No.: US 11,830,856 B2
(45) Date of Patent: Nov. 28, 2023

(54) SEMICONDUCTOR PACKAGE AND RELATED METHODS

(71) Applicant: SEMICONDUCTOR COMPONENTS INDUSTRIES, LLC, Phoenix, AZ (US)

(72) Inventors: Chee Hiong Chew, Seremban (MY); Erik Nino Tolentino, Seremban (MY); Vemmond Jeng Hung Ng, Senawang (MY); Shutesh Krishnan, Seremban (MY)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 757 days.

(21) Appl. No.: 16/745,762

(22) Filed: Jan. 17, 2020

(65) Prior Publication Data
US 2020/0286865 A1    Sep. 10, 2020

Related U.S. Application Data

(60) Provisional application No. 62/814,366, filed on Mar. 6, 2019.

(51) Int. Cl.
H01L 25/07 (2006.01)
H01L 23/00 (2006.01)
H01L 23/373 (2006.01)
H01L 25/18 (2023.01)
H01L 25/00 (2006.01)

(52) U.S. Cl.
CPC ........ *H01L 25/072* (2013.01); *H01L 23/3735* (2013.01); *H01L 24/40* (2013.01); *H01L 24/84* (2013.01); *H01L 25/18* (2013.01); *H01L 25/50* (2013.01); *H01L 2224/4001* (2013.01); *H01L 2224/4052* (2013.01); *H01L 2224/40137* (2013.01); *H01L 2224/40991* (2013.01); *H01L 2224/8484* (2013.01); *H01L 2224/84931* (2013.01); *H01L 2924/01029* (2013.01); *H01L 2924/01047* (2013.01); *H01L 2924/0503* (2013.01); *H01L 2924/1203* (2013.01); *H01L 2924/13055* (2013.01)

(58) Field of Classification Search
None
See application file for complete search history.

(56) References Cited

U.S. PATENT DOCUMENTS

| | | | |
|---|---|---|---|
| 5,544,412 | A | 8/1996 | Romero et al. |
| 6,933,593 | B2 | 8/2005 | Fissore et al. |
| 8,736,040 | B2 | 5/2014 | Hauenstein et al. |
| 9,659,837 | B2 | 5/2017 | Tolentino et al. |
| 9,911,712 | B2 | 3/2018 | Chew et al. |

(Continued)

FOREIGN PATENT DOCUMENTS

WO    2018185974 A1    10/2018

*Primary Examiner* — Michelle Mandala
*Assistant Examiner* — Jordan M Klein
(74) *Attorney, Agent, or Firm* — Adam R. Stephenson, LTD.

(57) ABSTRACT

Implementations of semiconductor packages may include one or more die coupled over a substrate, an electrically conductive spacer coupled over the substrate, and a clip coupled over and to the one or more die and the electrically conductive spacer. The clip may electrically couple the one or more die and the electrically conductive spacer.

19 Claims, 21 Drawing Sheets

(56) References Cited

U.S. PATENT DOCUMENTS

| | | |
|---|---|---|
| 9,991,185 B2 | 6/2018 | Tolentino et al. |
| 10,121,763 B2 | 11/2018 | Chew et al. |
| 2006/0192291 A1 | 8/2006 | Yokozuka |
| 2014/0264799 A1* | 9/2014 | Gowda ............ H01L 23/49575 |
| | | 438/122 |
| 2016/0172283 A1 | 6/2016 | Cho |
| 2017/0162481 A1* | 6/2017 | Lin ......................... H01L 24/72 |
| 2018/0182946 A1* | 6/2018 | Loeffler ................ H01L 31/167 |
| 2020/0035579 A1* | 1/2020 | Hoegerl ............ H01L 23/49531 |

* cited by examiner

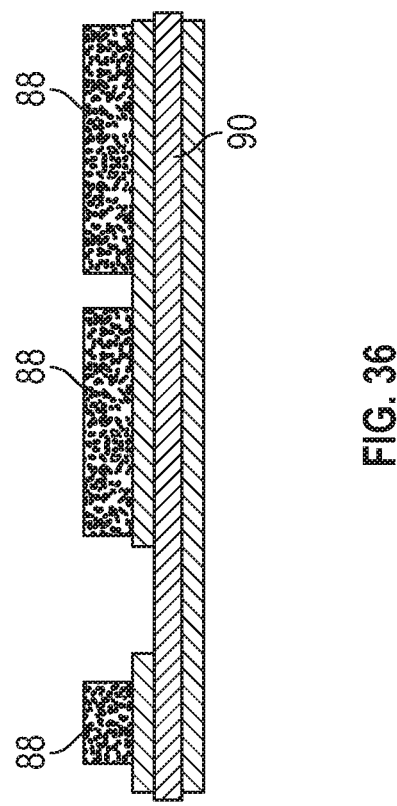
FIG. 36
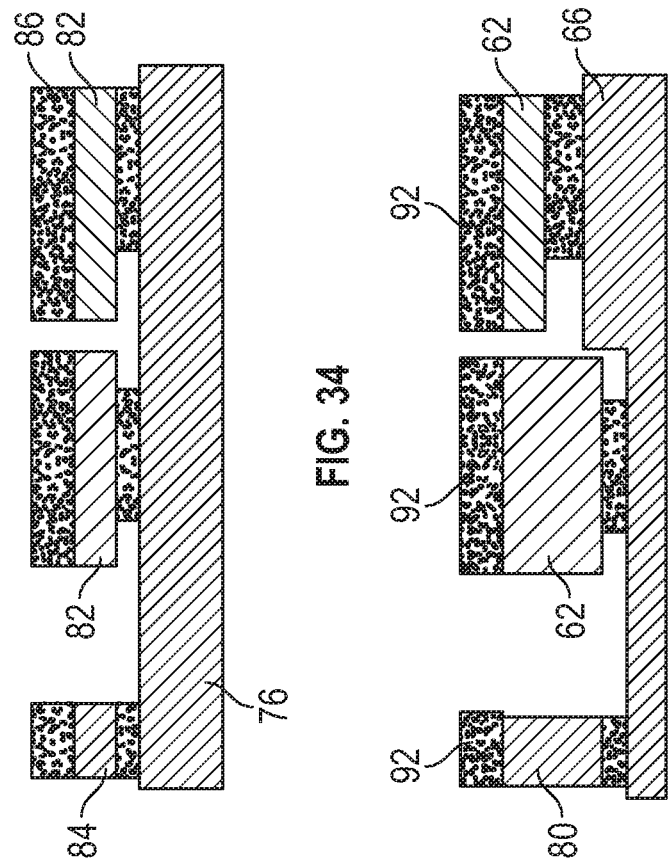
FIG. 34
FIG. 35

SEMICONDUCTOR PACKAGE AND RELATED METHODS

CROSS REFERENCE TO RELATED APPLICATIONS

This document claims the benefit of the filing date of U.S. Provisional Patent Application 62/814,366, entitled "Semiconductor Package and Related Methods" to Chee Hiong Chew which was filed on Mar. 6, 2019, the disclosure of which is hereby incorporated entirely herein by reference.

BACKGROUND

1. Technical Field

Aspects of this document relate generally to semiconductor devices including power semiconductor devices. Particular implementations also include power semiconductor devices including an electrical connection that is not a wirebond.

2. Background

Semiconductor packages may include a semiconductor substrate coupled to a chip. Methods of interconnecting components of the semiconductor package may include the formation of a wirebond. The wirebond may be formed through either wedge bonding or ball bonding.

SUMMARY

Implementations of semiconductor packages may include one or more die coupled over a substrate, an electrically conductive spacer coupled over the substrate, and a clip coupled over and to the one or more die and the electrically conductive spacer. The clip may electrically couple the one or more die and the electrically conductive spacer.

Implementations of semiconductor packages may include one, all, or any of the following:

The clip may include a first portion with a first thickness and a second portion with a second thickness.

The electrically conductive spacer may be a vertical connection system.

The clip may be coupled to the one or more die and the spacer through one of solder or an adhesive.

The one or more die may include an insulative gate bipolar transistor (IGBT) and a diode.

The electrically conductive spacer may include a copper foil.

The package may include only a single clip.

The electrically conductive spacer may be directly coupled to both the substrate and the clip through one of a solder, or an adhesive.

Implementations of semiconductor packages may include one or more die coupled over a substrate, an electrically conductive spacer coupled over the substrate, and a redistribution layer (RDL) comprising boron nitrite coupled over one or more die and the electrically conductive spacer. The RDL may electrically connect the one or more die and the electrically conductive spacer.

Implementations of semiconductor packages may include one, all, or any of the following:

The electrically conductive spacer may be directly coupled to both the substrate and the RDL through one of a solder or an adhesive.

The one of solder or the adhesive may include silver sintering material.

The RDL may include a plurality of electrical traces on one side.

The electrically conductive spacer may include a copper foil.

The substrate may include a direct bonded copper (DBC) substrate.

Implementations of methods of forming a semiconductor package may include applying sintering material over one of a first side of a plurality of die or a first side of a clip, applying sintering material to one of a first side of an electrically conductive spacer or the clip, pressure sintering the electrically conductive spacer and plurality of die to the clip through the sintering material, and applying sintering material to one of a second side of a plurality of die or a substrate, the second side opposite the first side of the plurality of die. The method may also include applying sintering material to one of a second side of the electrically conductive spacer or the substrate, the second side opposite the first side of the electrically conductive spacer, and pressure sintering the substrate to the electrically conductive spacer and plurality of die through the sintering material.

Implementations of methods of forming a semiconductor package may include one, all, or any of the following:

The plurality of die and the electrically conductive spacer may be flipped after they are pressure sintered to the clip, after which the plurality of die and the electrically conductive spacer may then pressure sintered to the substrate.

The method may include etching the clip.

The substrate may include a direct bonded copper (DBC) substrate.

The plurality of die and the electrically conductive spacer may be pressure sintered to the clip after the plurality of die and the electrically conductive spacer are pressure sintered to the substrate.

The sintering material may include silver sintering material.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 34 is a side view of a sintering material coupled over a plurality of die and a spacer coupled to a clip;

FIG. 35 is a side view of a sintering material coupled over a plurality of die and a spacer coupled to an etched clip;

FIG. 36 is a side view of a sintering material coupled over a substrate;

DESCRIPTION

This disclosure, its aspects and implementations, are not limited to the specific components, assembly procedures or method elements disclosed herein. Many additional components, assembly procedures and/or method elements known in the art consistent with the intended semiconductor package will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
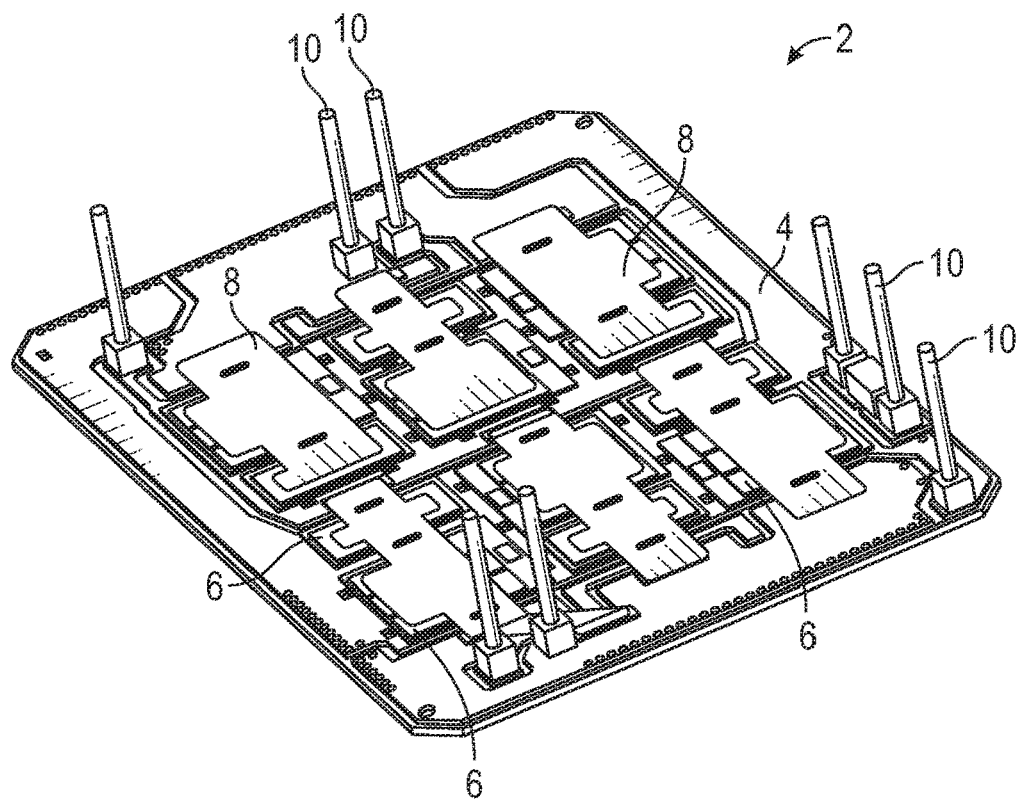
FIG. 1 is a perspective view of a semiconductor module.

Referring to FIG. 1, a perspective view of a semiconductor module is illustrated. In various implementations, the semiconductor module 2 may be a SSDC (single side direct cooling) semiconductor module or other type of semiconductor module. The semiconductor module 2 may include one or more thinned die which may be utilized in a high power and/or high switching applications. The semiconductor module 2 includes a substrate 4. The substrate 4, as illustrated by FIG. 1, may be a direct-bond-copper (DBC) substrate. While the implementations disclosed herein are illustrated as including DBC substrates, in other implementations other substrates may be used, including, by non-limiting example, insulated metal substrate technology (IMST) substrates, active metal bonding (AMB) substrates, substrates with an insulating layer between two metal or metal alloy layers, or other silicon and non-silicon containing substrates.

Still referring to FIG. 1, the semiconductor module 2 includes one or more die 6 coupled over the substrate 4. The die 6 may include various power devices, such as, by non-limiting example, metal-oxide semiconductor field-effect transistors (MOSFET), insulative-gate bipolar transistors (IGBT), diodes, or any other type of power semiconductor device. Such devices may have high current carrying capability. In other implementations, the semiconductor module may include die which are not power devices. In particular implementations, the die 6 may be thinned from an original fabrication thickness and configured to operate under high power output conditions.

As illustrated by FIG. 1, the semiconductor module 2 includes a plurality of clips 8 coupled over the one or more die 6. In various implementations, though not illustrated, a solderable top metal layer may be coupled over the one or more die 6. At least a clip of the plurality of clips 8 may also be coupled over a spacer, and in various implementations, each clip of the plurality of clips 8 may be coupled over a spacer. In the implementations disclosed herein, the clip may electrically couple the one or more die and the spacer. The spacer is also coupled over the substrate 4. The spacer may be directly coupled to both the substrate and the clip through a solder or other adhesive. In particular implementations, adhesives include a sintering material, including silver sintering material. In various implementations, and as used herein, the spacers are electrically conductive spacers. In other implementations the spacers may be non-electrically conductive. Each of the spacers is also a vertical connection system that provides electrical or thermal or both electrical and thermal connection with the die.

The spacers are not illustrated in FIG. 1 as they are covered by the clips 8. In various implementations, the spacers may be a metallic material or metal alloy and may include, by non-limiting example, copper, brass, copper cladded with aluminum, or any other type of metallic material or layered metallic material. In particular implementations, the spacers may include a copper foil. In various implementations, the plurality of clips 8 may be copper, silver, palladium, nickel, gold or any other metal, alloy thereof, or combination of metals. In particular implementations, the bottom side of the clip may be bare copper, plated with silver, palladium, nickel, gold, or any other metal or alloy thereof. In still other implementations, the clips 8 may include a non-metallic electrically and/or thermally conductive material. In implementations including one or more clips 8, the clips interconnection to the die 6 may provide low on-state resistance (RDS) of the semiconductor module 2. The clips may also be able to fully utilize the die's top metallization in various implementations. Further, the clips 8 may reduce the risk of damage to the die 6 as the force used to form the wirebond is eliminated through use of the clips 8. The clips 8 may ultimately lead to improved power management, better thermal performance, and higher reliability. While FIGS. 1-2 illustrate a plurality of clips, in other implementations a module and/or package may include only a single clip.

In various implementations, each clip 8 may cover a single spacer and two or more die. In particular implementations, the single clip may cover an IGBT, a diode, and a spacer. In various implementations, the spacer may provide an extended/lengthened connection between the substrate and the dies. The spacer may compensate for unevenness among the die as the spacer can compensate for the differences between the various thicknesses of the substrate and/or die and/or die attach or clip attach materials. Further, the spacer may fill a gap between the clip 8 and the substrate 4 and provide additional structural support to the clip 8. In various implementations the clip 8 may include a single thickness across the clip. In other implementations, the clip 8 may include a first portion having a first thickness and a second portion having a second thickness. Such a clip 8 may be formed through etching or stamping the clip 8.

Each clip 8 may be bonded to the die 6 and the spacer through a conductive adhesive. In various implementations, the adhesive may include a sintering material, and in particular implementations, may include a silver sintering material. In such implementations, the silver sintering material may act to maximize as much as possible the thermal and electrical efficiency of the semiconductor module 2. While the implementations described herein primarily reference a silver sintering material, it is understood that other sintering, solder, bonding, or adhesive materials may be used in place of the silver sintering material. As illustrated by FIG. 1, the semiconductor module 2 may include a plurality of pins 10. While the implementations disclosed herein include a silver sintering material, it is understood that in other implementations any other electrically conductive adhesive/die attach material may be used.

Figure 2:
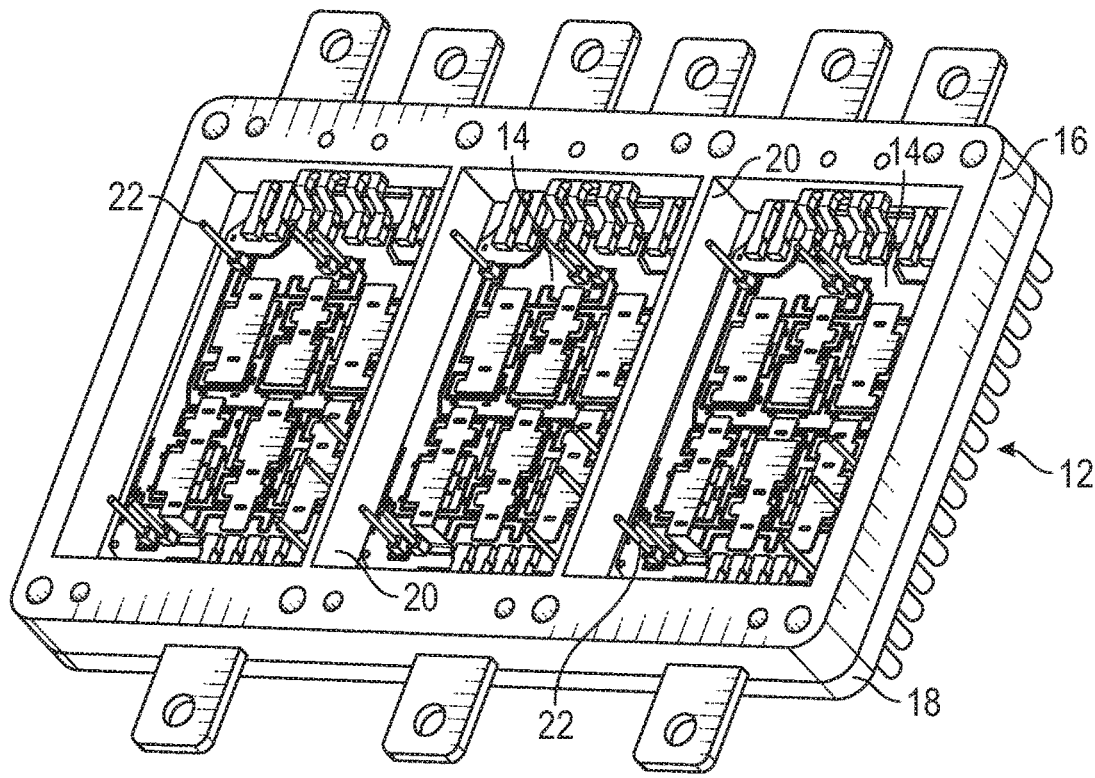
FIG. 2 is a perspective view of a semiconductor package.

Referring to FIG. 2, a perspective view of an implementation of a semiconductor package is illustrated. In various implementations, the semiconductor package 12 may include one or more of the semiconductor modules 14 coupled to a casing 16 and a back plate 18. Each of the semiconductor modules 14 may be the same or similar to the semiconductor module of FIG. 1. In the implementation illustrated by FIG. 2, three modules are included in the semiconductor package. In various implementations, the casing 16 may include one or more struts 20 dividing the semiconductor modules 14. Though not illustrated, in various implementations the interior of the casing may be filled with an encapsulant covering the semiconductor modules 14. The encapsulant may include a potting compound, and in particular implementations, may include a gel potting compound. The semiconductor package may include pins 22 which may be exposed through the encapsulant.

Figure 4:
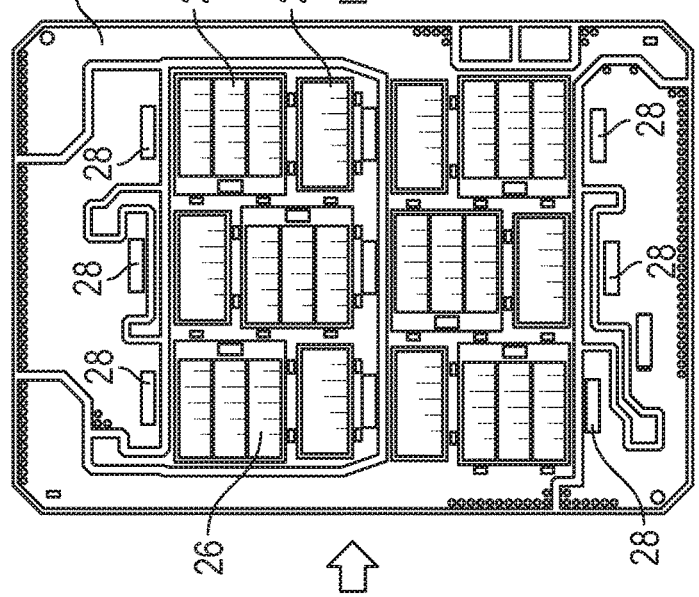
FIG. 4 is a top view of a plurality of die and spacers coupled over the substrate of FIG. 3.
Figure 3:
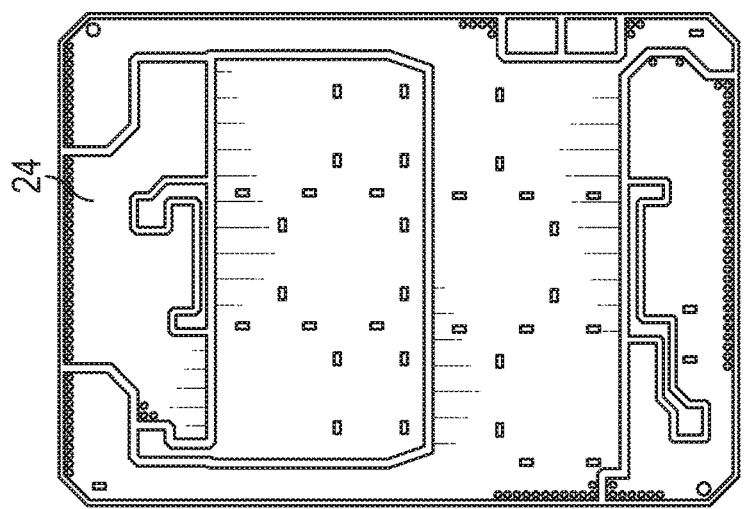
FIG. 3 is a top view of a substrate.

Referring to FIGS. 3-14, an implementation of a semiconductor package at various points in an implementation of a method of forming the semiconductor package of FIG. 2 is illustrated. Referring specifically to FIG. 3, a top view of a substrate is illustrated. The method may include providing any type of substrate disclosed herein, including a DBC substrate 24. The substrate 24 may include a variety of patterns/traces thereon. Referring to FIG. 4, a top view of a plurality of die and spacers coupled over the substrate of FIG. 3 is illustrated. The die may 26 include any type of die disclosed herein. The spacers 28 may include any type of material disclosed herein and in particular implementations, may include a metal foil, such as a copper foil, though any metal material previous disclosed herein could be used. In various implementations, the method may include applying sintering material over a first side of a plurality of die and applying sintering material to a first side of the spacer. In other implementations, the sintering material may be applied to the substrate 24. The die 26 and spacers 28 may be coupled to the substrate through an adhesive, and in particular implementations, may be coupled to the substrate through a solder material or a silver sintering material. In implementations having a silver sintering material, the silver sintering material may be applied to the substrate 24 or plurality of die 26 and the spacer 28 through, by non-limiting example, screen printing, film lamination, stencil printing, and other methods of applying a liquid or semiliquid material. In various implementations, the die 26 and spacers 28 may be coupled to the substrate 24 through the sintering material by means of hot die placement. In other implementations, the spacers 28 may be bonded to the substrate 24 through methods such as, by non-limiting example, ultra-sonic bonding, welding, soldering, or any other method of attachment. The spacers 28 disclosed herein may include a solderable surface layer on them which may be formed using, by non-limiting example, electroplating, electroless plating, sputtering, or any other method of depositing a solderable material.

Figure 5:
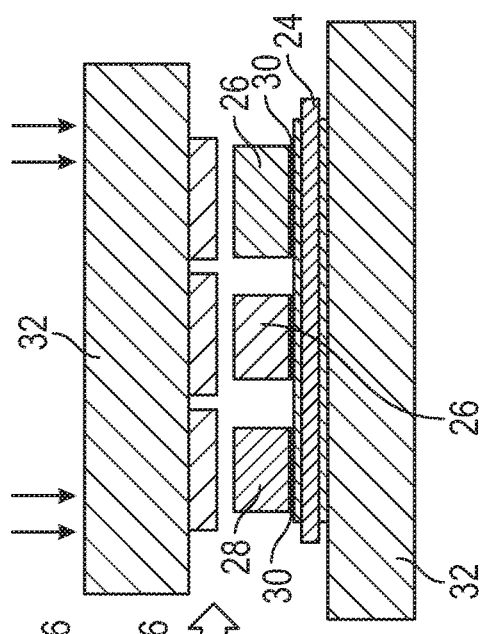
FIG. 5 is a cross-sectional side view of a plurality of die, a spacer, and a substrate in a sintering tool.

Referring to FIG. 5, a side view of a plurality of die and a spacer pressure sintered to a substrate is illustrated. In various implementations, the method of forming the semiconductor package may include curing the silver sintering material 30. In various implementations, the silver sintering material may be cured between about 80 C to about 150 C. In various implementations, the die 26 and spacer 28 may be bonded to the substrate 24 by placing the substrate 24, die 26, and spacer 28 in a sintering tool 32 and applying pressure to the die, spacer, and the substrate. In various implementations, heat, low heat, or no heat may be applied to the sintering material in conjunction with the pressure. In other implementations, the curing may include the application of heat without any pressure applied to the die 26, spacer 28, or substrate 24.

Figure 6:
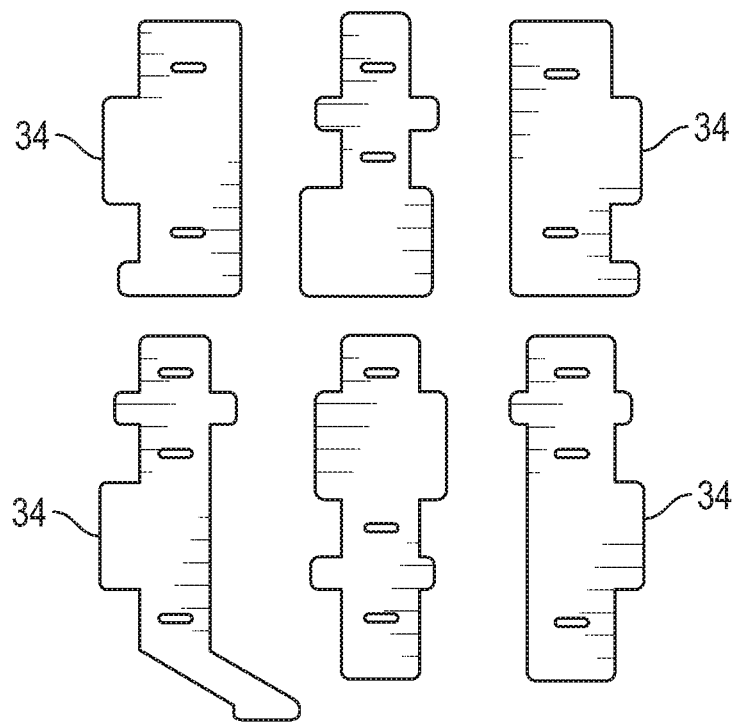
FIG. 6 is a top view of a plurality of clips.
Figure 7:
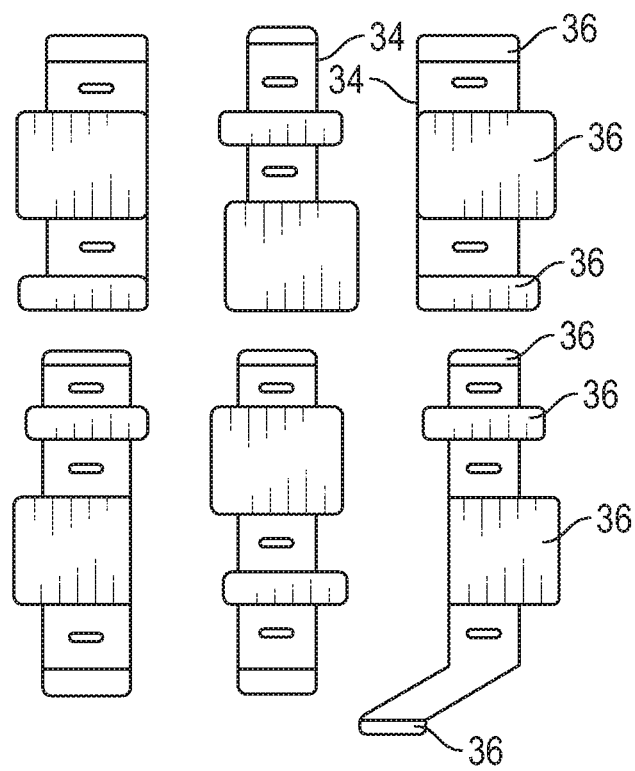
FIG. 7 is a bottom view of the plurality of clips of FIG. 6.
Figure 8:
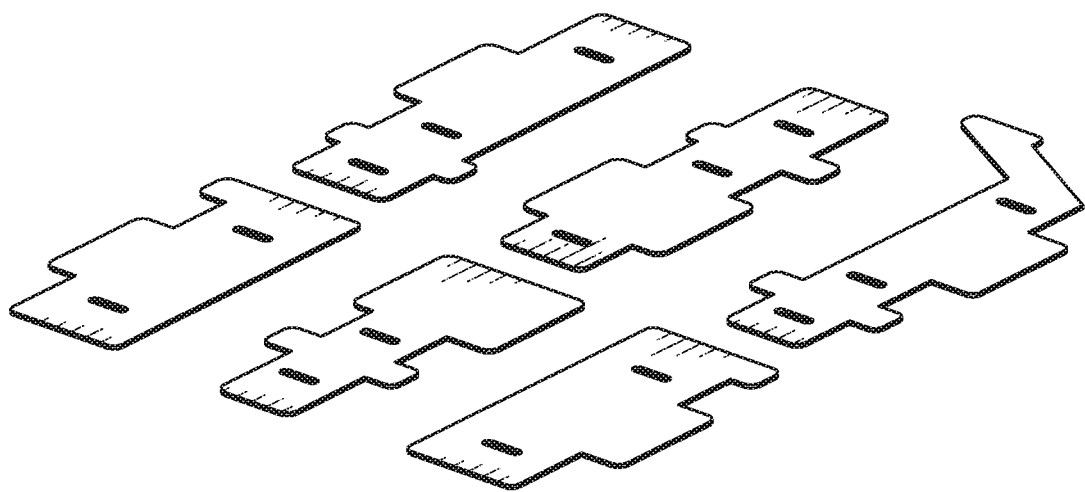
FIG. 8 is a top perspective view of the plurality of clips of FIG. 6.
Figure 9:
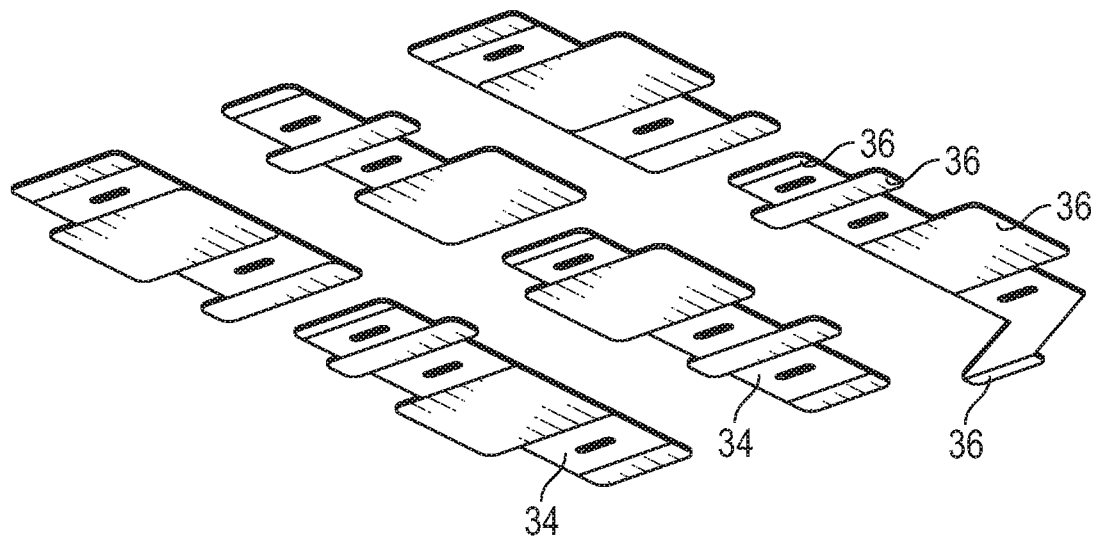
FIG. 9 is a bottom perspective view of the plurality of clips of FIG. 6.

Referring to FIG. 6, a top view of a plurality of clips is illustrated, and referring to FIG. 8, a top perspective view of the plurality of clips is illustrated. The number of clips, the size of the clips, and the shapes of the clips may all correspond with the die and the spacers coupled to the substrate in such a way that the clips 34 may be configured to couple select die and at least one spacer to one another. Thus, while FIG. 6 is illustrated as including six different clips, other implementations may include more or less than six clips. While the clips 34 illustrated in FIGS. 6 and 8 appear flat, in other implementations the clips may be patterned, angled, bent, stepped, down set, or half etched. Patterned, angled, bent, down set, etched, or stepped clips may be used in conjunction of die and/or spacers having surfaces with varying heights/positions/thicknesses at different locations along the clips. In particular implementations including a down set clip, the down set portion may be added with a stepped structure. The down set portion may be a single or dual gauge system. Referring to FIG. 7, a bottom view of the plurality of clips of FIG. 6 is illustrated, and referring to FIG. 9, a bottom perspective view of the plurality of clips of FIG. 7 is illustrated. In various implementations, the method of forming the semiconductor substrate may include applying an adhesive 36 to a bottom of the plurality of clips 34. In particular implementations, the adhesive may include a silver sintering material. The silver sintering material may be applied to the clips through, by non-limiting example, dispensing techniques such as screen printing, or film lamination. The sintering material may be applied to the clips in an area corresponding to the die and the spacers coupled to the substrate. In other implementations, the adhesive may be applied to the die and spacers prior to their being coupled to the clips.

Figure 11:
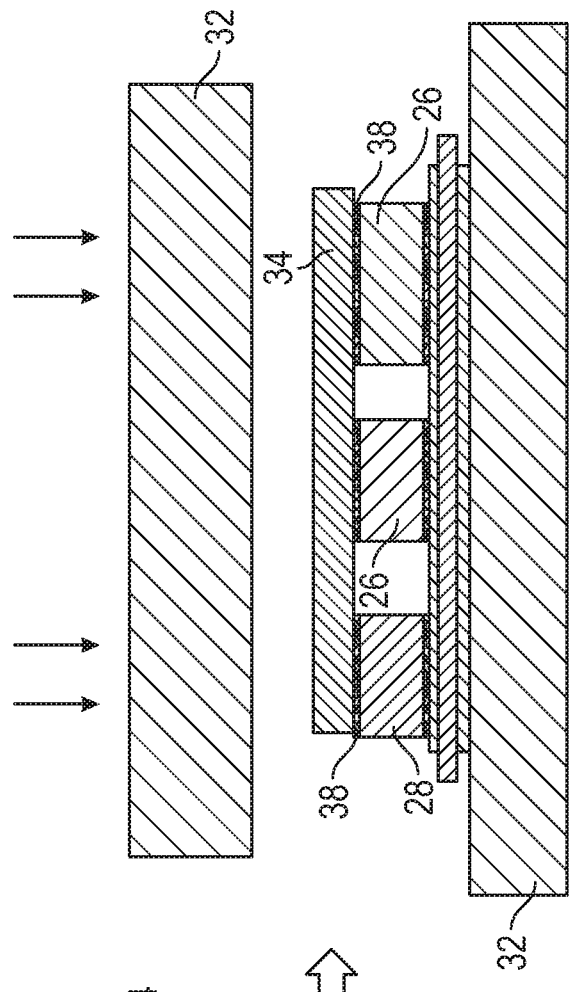
FIG. 11 is a cross sectional side view of the semiconductor module of FIG. 10 in a sintering tool.
Figure 10:
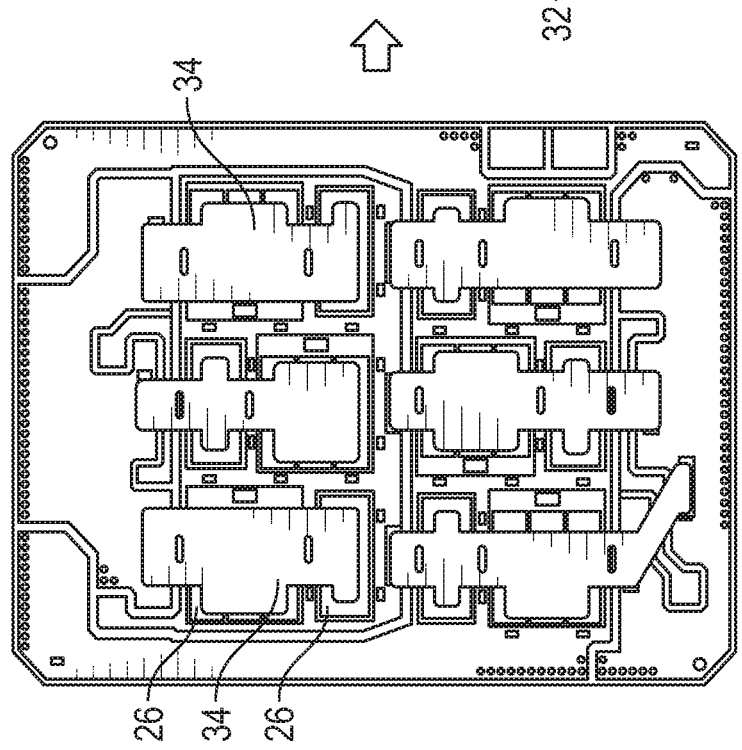
FIG. 10 is a top view of a plurality of clips coupled over a plurality of die and a plurality of spacers.

Referring to FIG. 10, a top view of the plurality of clips coupled over the die and a plurality of spacers is illustrated. After coupling the clip 34 to the die 26 and the spacers 28, as illustrated by FIG. 10, the method may include curing the adhesive a second time. Referring to FIG. 11, a cross sectional side view of the semiconductor module of FIG. 10 in a sintering tool is illustrated. In various implementations, the method of forming the semiconductor package may include curing the sintering material 38 between the clips 34 and the die 26 and spacers 28. The method may include bonding the clip 34 to the die 26 and the spacers 28 through a pressure sintering process which may include applying pressure to the clips 34, die 26, and spacers 28 through the sintering tool 32 as illustrated by FIG. 11. In various implementations, heat, low heat, or no heat may be applied to the sintering material 38 in conjunction with the pressure. In other implementations, the bonding process may include the application of heat without any pressure applied to the die 26, spacers 28, or clips 34.

In various implementations, while two curing steps may be used, in other method implementations, a single curing step may be used where the sintering tool is used to cure both all of the sintering material at the same time.

Figure 12:
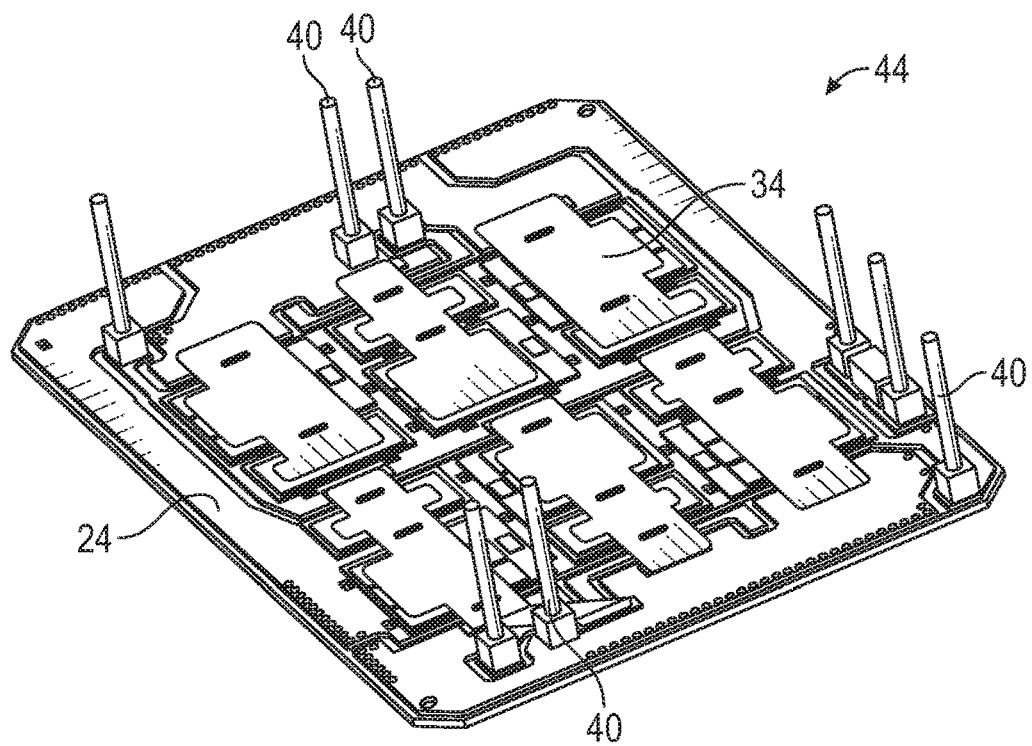
FIG. 12 is a perspective view of a semiconductor module.

Referring to FIG. 12, a top perspective view of a semiconductor module is illustrated. In various implementations, the semiconductor module 44 of FIG. 12 is the same as the semiconductor module of FIG. 1. In various implementations, the method of forming a semiconductor package may include coupling a plurality of pins 40 to the substrate 24. In such implementations, the pins 40 may be coupled to the substrate 24 through dispensing a soldering paste to the area of the substrate to be coupled to the pins 40. The pins 40 and any other elements (such as a thermistor) may be coupled to the solder paste and the solder paste may then be reflowed, bonding the pins 40 to the substrate 24 and/or bonding the module assembly to the heat sink. A guide jig may be used to hold the pins 40 in place during reflow of the soldering paste.

Figure 13:
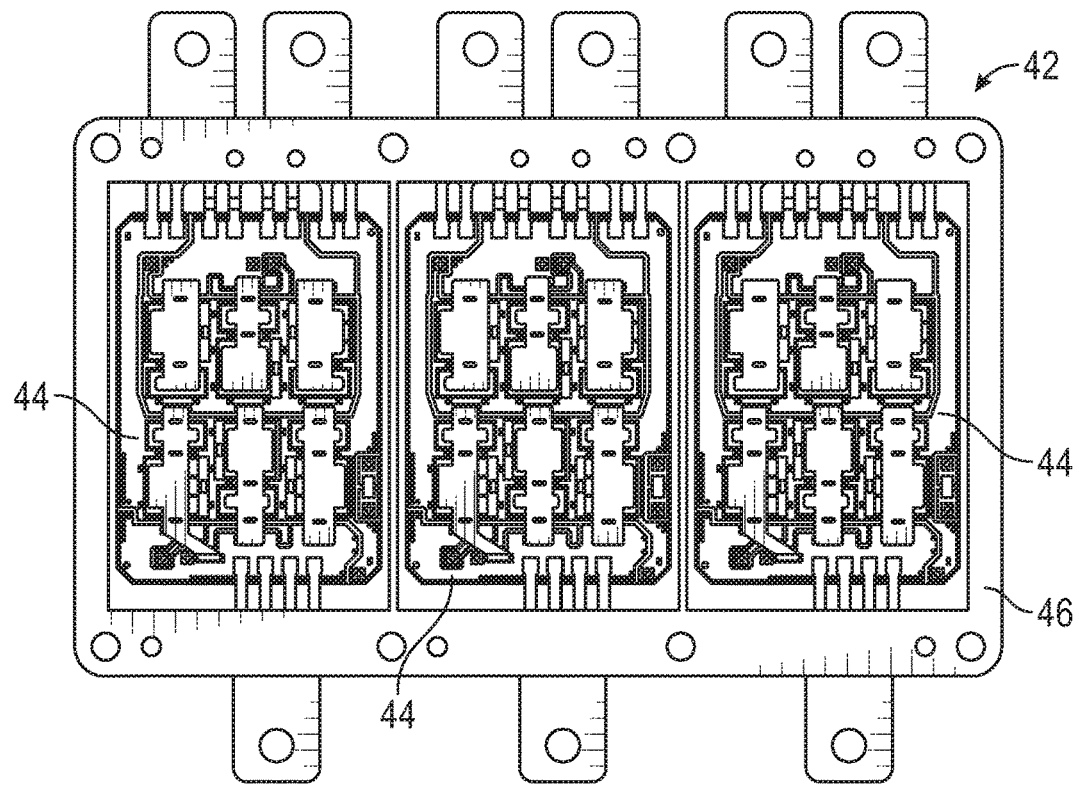
FIG. 13 is a top view of a semiconductor package.
Figure 14:
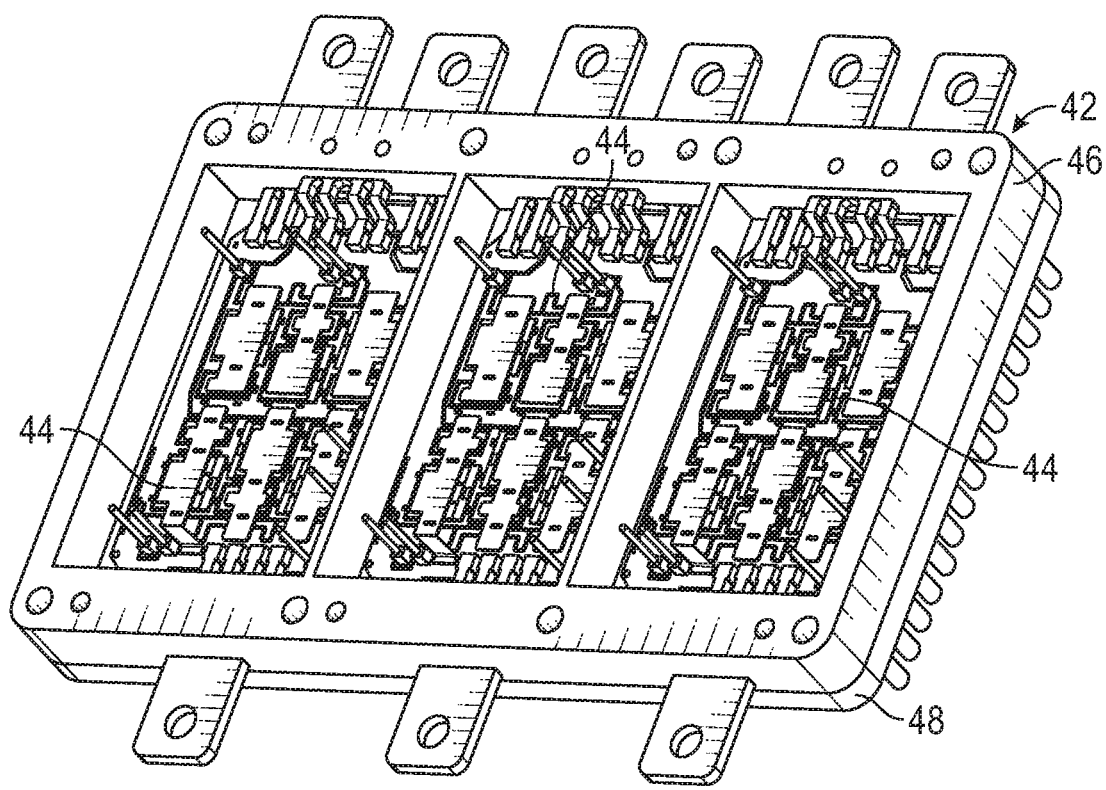
FIG. 14 is a top perspective view of a semiconductor package.

Referring to FIG. 13, a top view of a semiconductor package is illustrated, and referring to FIG. 14, a top perspective view of the semiconductor package of FIG. 13 is illustrated. In various implementations, the semiconductor package 42 of FIGS. 13-14 may be the same as the semiconductor package of FIG. 12. In various implementations, the method of forming a semiconductor package 42 may include coupling a casing 46 over one or more semiconductor modules 44. While the semiconductor package of FIG. 13 is illustrated as including three semiconductor modules, other semiconductor packages may include more or less modules, including, only one module, two modules, a partial module, four modules, or more than four modules. The method of forming the semiconductor package may also include coupling the semiconductor package 42 to a back plate 48 on the side of the semiconductor module opposite the side coupled to the casing. Though not illustrated, the method may also include applying any type of encapsulant disclosed herein within the casing 46 and over the semiconductor modules 44.

Any components or elements of the implementation of the semiconductor package of FIGS. 13-14 or of the method of making the semiconductor package of FIG. 13-14 may be used in any other implementation disclosed herein.

Figure 15:
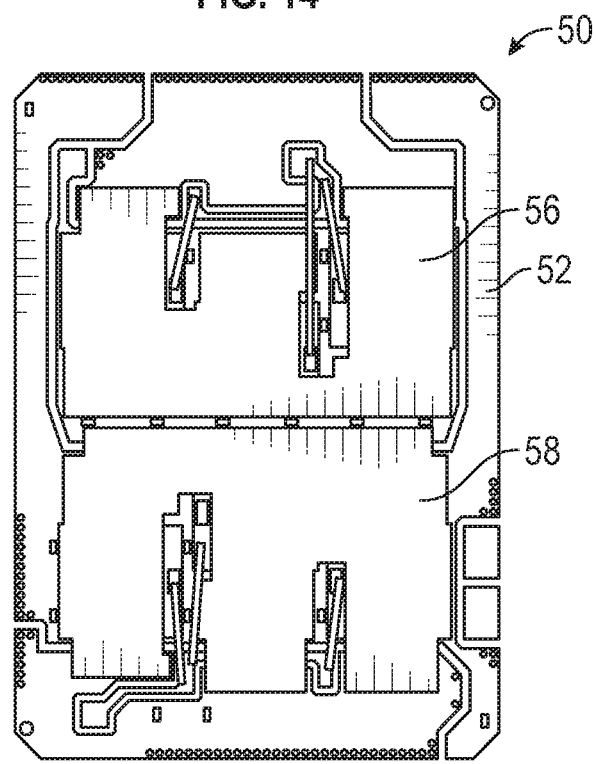
FIG. 15 is a top view of another implementation of a semiconductor module.

Referring to FIG. 15, a top view of another implementation of a semiconductor module is illustrated. In various implementations, the semiconductor module 50 of FIG. 15 may be similar to the semiconductor module 2 of FIG. 1. The semiconductor module 50 includes a substrate 52. In various implementations, the substrate may be a DBC substrate or any other type of substrate disclosed herein. The substrate may be coupled to a plurality of die (covered by the clip) and may also include one or more spacers (covered by a clip). The die may be any type of die disclosed herein and the spacers may be the same as or similar to any other spacer disclosed herein. The die and the spacers may be coupled to the substrate 52 through an adhesive, which, in particular implementations, may be a silver sintering material. In other implementations, the die and spacers may be coupled to the substrate 52 through a solder.

As illustrated by FIG. 15, the semiconductor module includes a first clip 56 and a second clip 58 coupled over the plurality of die and the one or more spacers. While FIG. 15 is illustrated as having two clips, other implementations may include more than two clips or only a single clip. The first clip 56 and the second clip 58 may be any type of clip disclosed herein and may include a size and pattern corresponding with the size, placement, and shape of the various die and spacers it covers. The first clip 56 and second clip 58 may be coupled to the die and the spacers through an adhesive, which may be a silver sintering material. In other implementations the first clip 56 and the second clip 58 may be coupled to the die and spacers through a solder. In implementations including one or more clips, the clip interconnection to the die may provide low on-state resistance (RDS) of the semiconductor module. The clips may also be able to fully utilize the die's top metallization. Further, the clips may reduce the risk of damage to the die as the force used to form the wirebond is eliminated with the clips. The clips may ultimately lead to improved power management, better thermal performance, and higher reliability.

Figure 19:
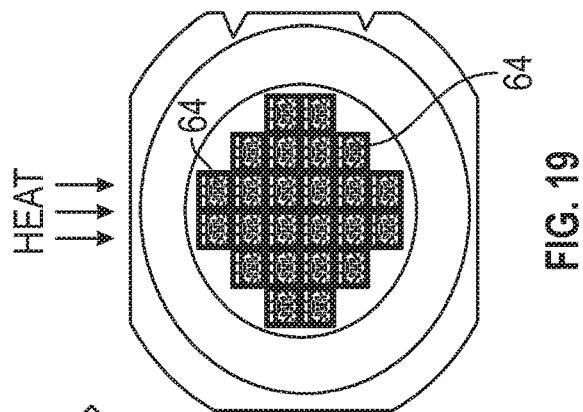
FIG. 19 is a top view of the plurality of die of FIG. 18 during a curing process.
Figure 18:
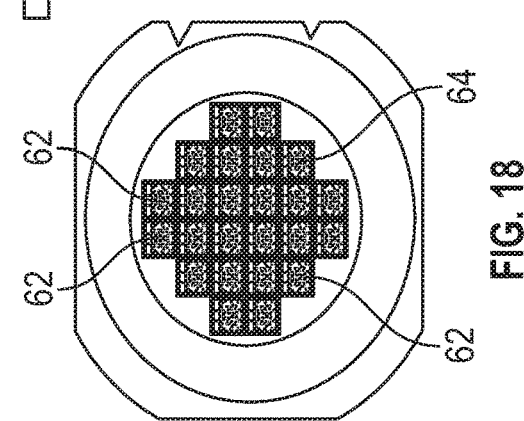
FIG. 18 is a top view of the plurality of die of FIG. 17 covered by a sintering material.
Figure 17:
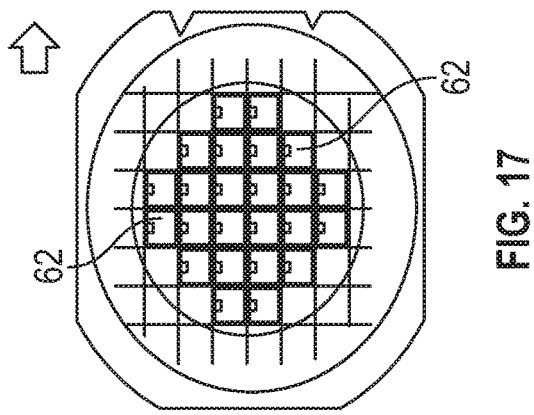
FIG. 17 is a top view of a plurality of die singulated from the wafer.
Figure 16:
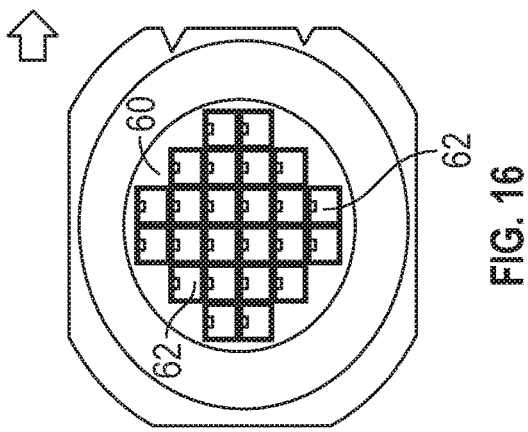
FIG. 16 is a top view of a wafer.
Figure 22:
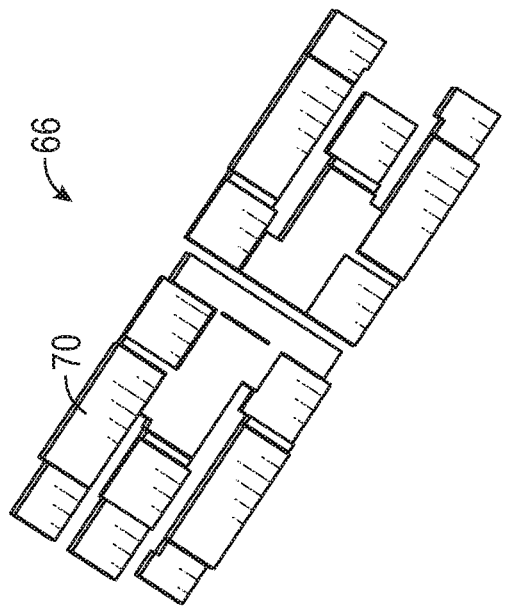
FIG. 22 is a bottom perspective view of the plurality of clips of FIG. 20.

Referring to FIGS. 16-40, semiconductor packages at various steps in an implementation of a method of forming the semiconductor package of FIG. 15 are illustrated. Referring specifically to FIG. 16, a top view of a wafer is illustrated. The wafer 60 may include a plurality of die 62. The plurality of die 62 may include any type of die disclosed herein. Referring to FIG. 17, a top view of a plurality of die singulated from the wafer is illustrated. The method of forming a semiconductor package includes singulating the plurality of die 62. The die 62 may be singulated through, by non-limiting example, a mechanical saw, a laser, water jet, plasma etching, or any other singulation technique. Referring to FIG. 18, a top view of the plurality of die of FIG. 17 covered by a sintering material is illustrated. In various implementations, the method of forming the semiconductor package includes dispensing an adhesive, which may be a sintering material 64, over the source pad areas of the plurality of die 62. In particular implementations, the adhesive may include a silver sintering material. The sintering material 64 may be screen printed, stencil printed, laminated, or deposited using any other technique disclosed in this document. While the implementation illustrates the sintering material 64 being applied to the die 62 after singulation, in other implementations the sintering material may be applied to the die prior to singulation. Referring to FIG. 19, a top view of the plurality of die of FIG. 18 being cured is illustrated. As illustrated, the method may include curing the sintering material 64 through the application of heat. The sintering material 64 may be heated to a temperature between about 80 C to about 150 C, though in other implementations it may be heated to a temperature more or less than this.

Figure 24:
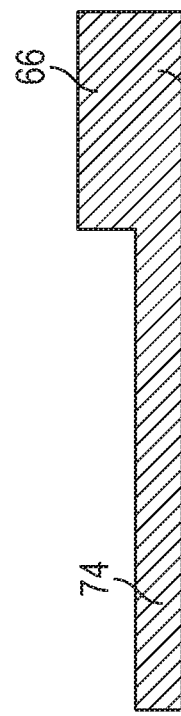
FIG. 24 is a side view of an etched clip.
Figure 21:
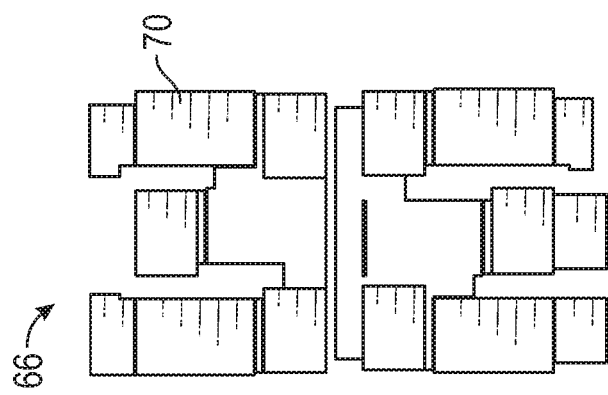
FIG. 21 is a bottom view of the plurality of clips of FIG. 20.
Figure 20:
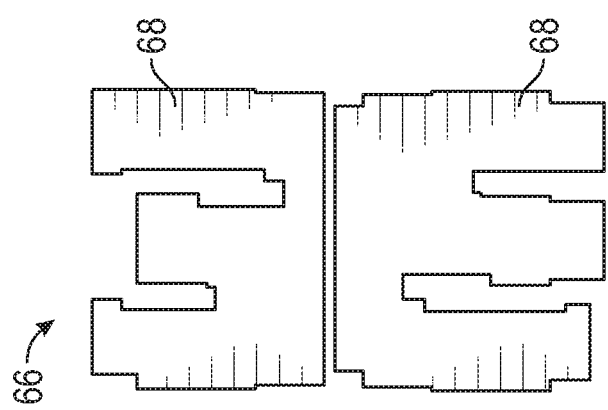
FIG. 20 is a top view of a plurality of clips.

Referring to FIG. 20, a top view of a first implementation of a plurality of clips is illustrated. The clips 66 may include any type of material disclosed herein. In particular implementations, the clips 66 may be copper or a copper alloy. The clips 66 may be patterned to correspond with a particular layout of die and/or spacers. As illustrated, the clips may be flat across the face 68 of the clips 66. Referring to FIG. 21, a bottom view of the plurality of clips of FIG. 20 is illustrated, and referring to FIG. 22, a bottom perspective view of the plurality of clips of FIG. 20 is illustrated. As illustrated, the clips 66 may be patterned, stepped, bent, or half etched across the face 70 of the clips 66 opposing face 68. This may be portrayed by FIG. 24, which shows a portion of the side view of the clip 66 of FIG. 20. As illustrated by FIG. 24, the thickness of the clip is stepped. The step in the clip may be formed through, by non-limiting example, a stamp or a half etching process. In various implementations, the clips of FIG. 20 may be used if it is to be coupled to die having unequal thicknesses. As illustrated by FIG. 24, the a first portion 72, which may be thicker portion, of the clip 66 may be about 175 µm thick and the second portion 74, which may be a thinner portion, of the clip 66 may be about 50 µm thick. In other implementations, the thickness of the respective portions may be more or less thick than what is illustrated by FIG. 24. In still other implementations, the clip 66 may include more than two portions having different thicknesses.

Figure 23:
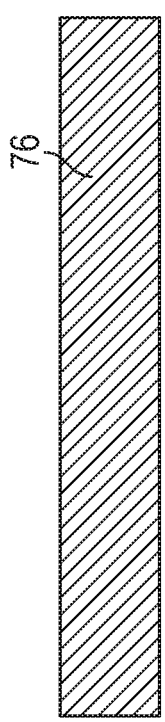
FIG. 23 is a side view of a clip.

In other implementations, the clip may not be etched or stepped by may have a planar first face and opposing second face. As illustrated by FIG. 23, a side view of a clip is illustrated. The clip 76 of FIG. 23 may be used when the die it is coupled to have equal thicknesses. As illustrated by FIG. 23, the thickness of the clip 76 is consistent. In various implementations, the thickness of the clip 76 may be 175 µm, while in other implementations the clip may be more or less thick than 175 µm.

Figure 25:
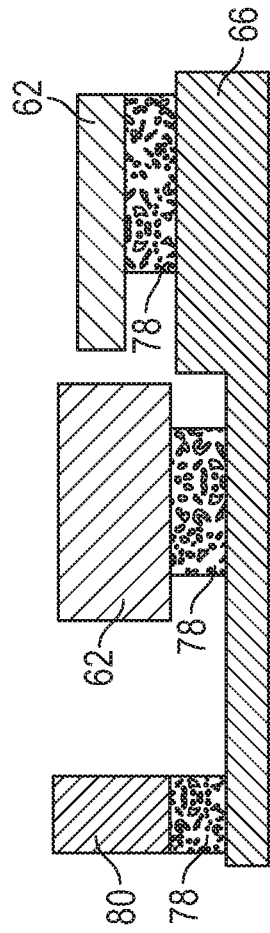
FIG. 25 is a top view of a plurality of die and a spacer covered by a sintering material.
Figure 26:
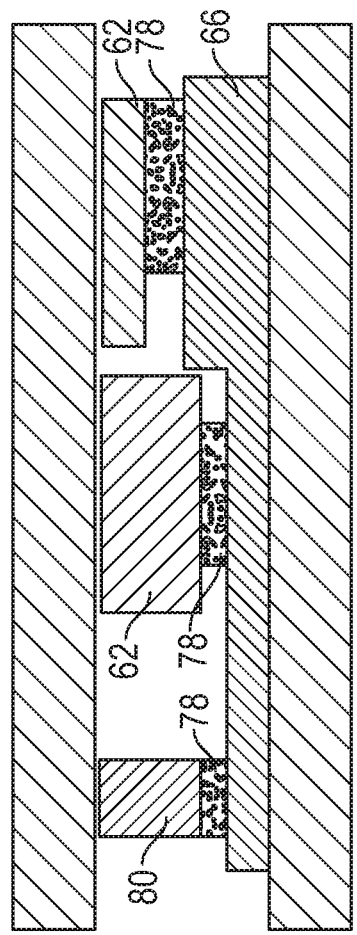
FIG. 26 is a side view of a plurality of die and a spacer coupled to an etched clip.
Figure 27:
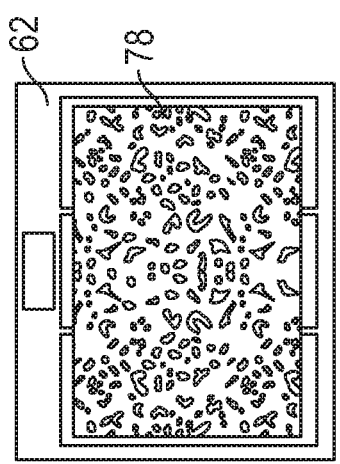
FIG. 27 is a side view of the plurality of die and the spacer of FIG. 26 in a sintering tool.

Referring to FIG. 25, a top view of a plurality of die and a spacer covered by a sintering material is illustrated. In particular implementations, the sintering material 78 may be a silver sintering material. The sintering material 78 may be coupled to the die 62 using any method previously disclosed herein. In various implementations, the sintering material may be applied to the spacer 80 using a method similar to the method in which the sintering material is applied to the die. In various implementations, the method of forming the semiconductor package includes coupling the die 62 and the spacer 80 to a clip. Referring to FIG. 26, a side view of a plurality of die and a spacer coupled to an etched clip is illustrated. As illustrated by FIG. 26, the method may include coupling the plurality of die 62 and the spacer 80 over the clip 66 with the sintering material 78 between the clip and the die and the spacer. The die and/or spacer may be flipped and coupled to the clip using hot die placement techniques in various method implementations. Referring to FIG. 27, a side view of the plurality of die and the spacer of FIG. 26 being pressure sintered to the clip is illustrated. As illustrated by FIG. 27, after the die 62 have been flipped, the die 62, spacer 80, and clip 66 may be placed into a sintering tool 82 and subjected to a sintering process. The sintering process may be similar to any sintering process disclosed herein. Due to the stepped or etched clip 66, the height between the die 62 and the spacer 80 may be equal.

Figure 28:
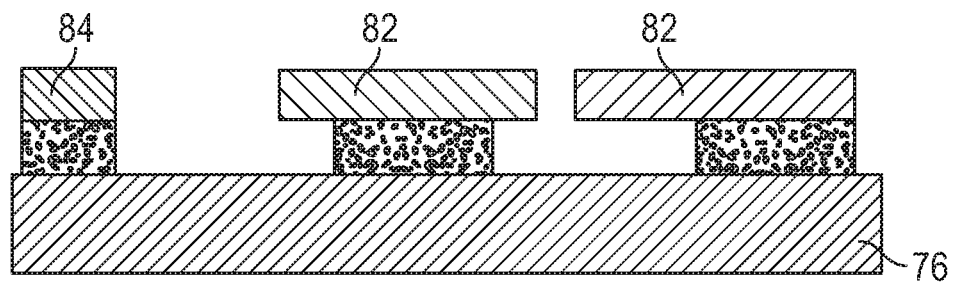
FIG. 28 is a side view of a plurality of die and a spacer coupled to a clip.
Figure 29:
FIG. 29 is a side view of the plurality of die and the spacer of FIG. 28 in a sintering tool.
Figure 29:
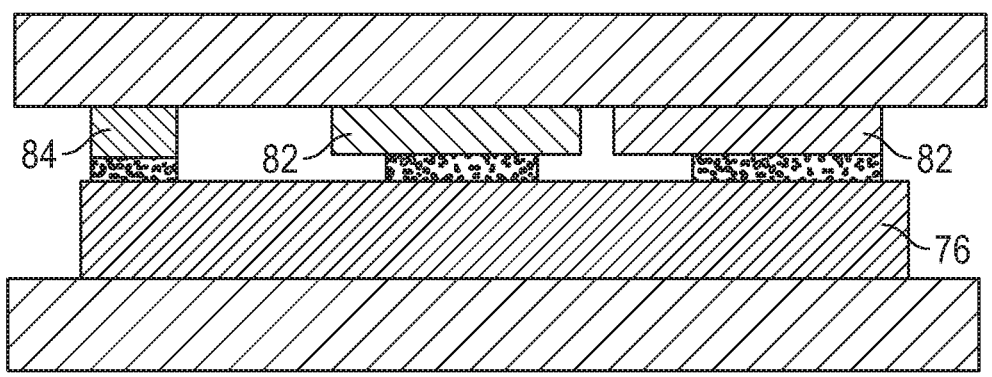

Referring to FIGS. 28-29, an implementation of a package at a step of an implementation of a method for coupling die having equal thickness to a planar clip (such as clip 76 of FIG. 23) is illustrated. Referring specifically to FIG. 28, a side view of a plurality of die 82 and a spacer 84 coupled to a clip 76 is illustrated. Referring to FIG. 29, a side view of the plurality of die and the spacer of FIG. 28 in a sintering tool is illustrated. The die 82 and spacer 84 may be coupled to the clip 76 using the same method as illustrated by FIGS. 26-27, with the only difference being that the clip is not stepped and each of the die 82 and the spacer 84 include similar thicknesses.

Figure 30:
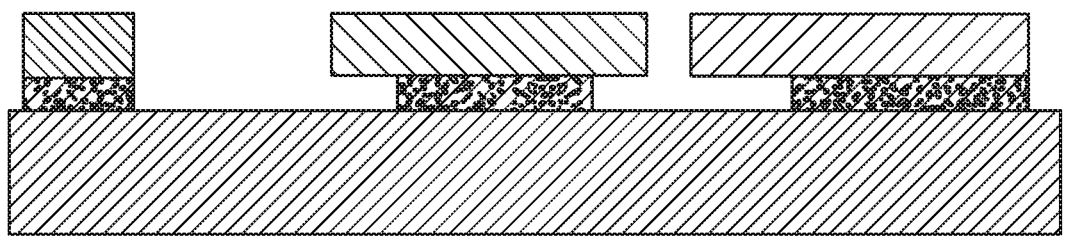
FIG. 30 is a side view of a plurality of die and a spacer of FIG. 29 coupled to the clip after being pressure sintered.
Figure 32:
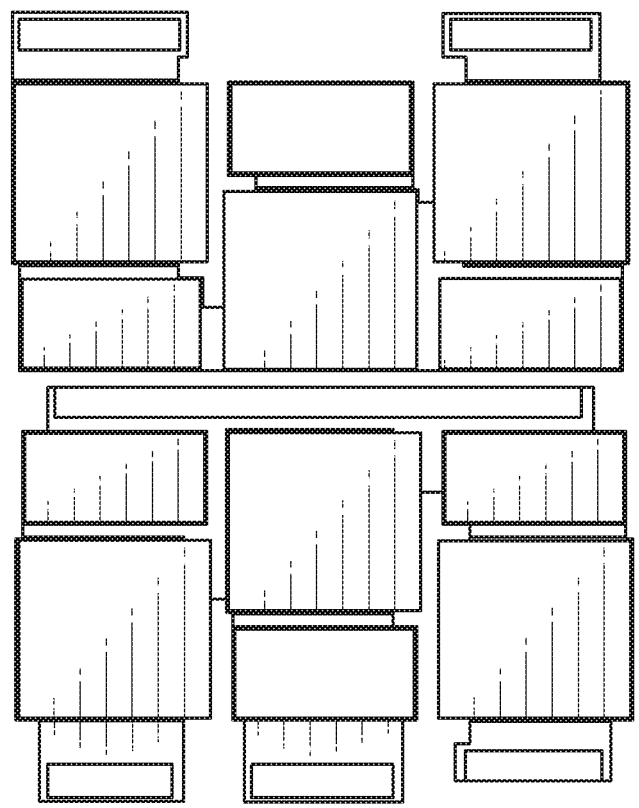
FIG. 32 is a bottom view of a plurality of die and spacers coupled to a clip.
Figure 33:
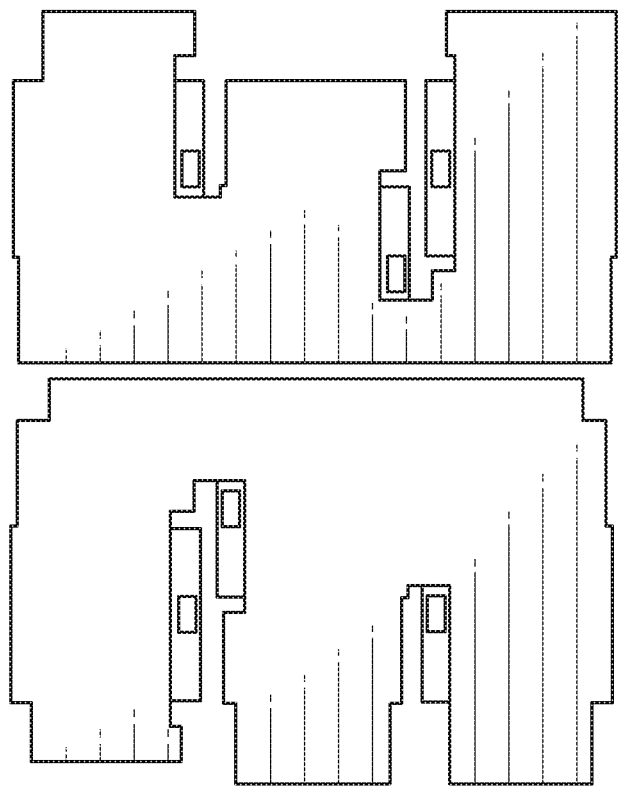
FIG. 33 is a top view of a plurality of die and spacers coupled to a clip.

Referring to FIG. 30, a cross sectional side view of a plurality of die and a spacer of FIG. 29 coupled to a clip after being pressure sintered is illustrated. Similarly, referring to FIG. 31, a side view of a plurality of die and a spacer of FIG. 27 coupled to the clip after being pressure sintered is illustrated. Referring to FIG. 32, a bottom view of a plurality of die and spacers of FIG. 31 coupled to the clip is illustrated. Referring to FIG. 33, a top view of a plurality of die and spacers coupled to the clip of FIG. 31 is illustrated.

Referring specifically to FIG. 34, a side view of a sintering material coupled over a plurality of die and a spacer coupled to the clip of FIG. 30 is illustrated. In various implementations, the method may include flipping the die 82 and spacer 84 coupled to the clip 76 after they are bonded to the clip and coupling an adhesive, which may be any type of adhesive disclosed herein including a sintering material 86, over the die 82 and the spacer 84 coupled to the planar clip 76. The sintering material 86 may be applied using any technique disclosed herein.

Figure 31:
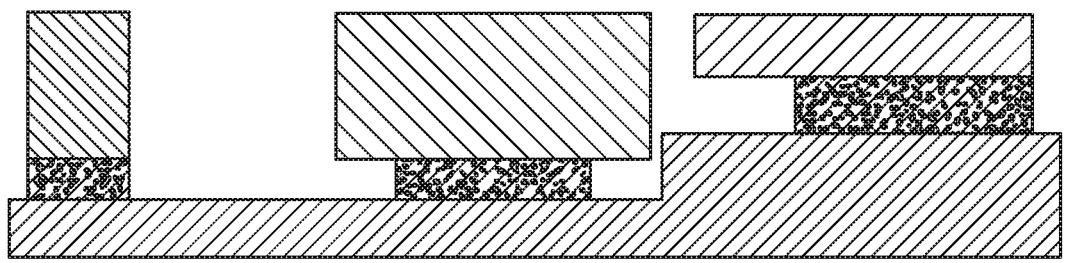
FIG. 31 is a side view of a plurality of die and a spacer of FIG. 27 coupled to the clip after being pressure sintered.

Referring specifically to FIG. 35, a side view of a sintering material coupled over a plurality of die and a spacer coupled to the clip of FIG. 31 is illustrated. In various implementations, the method may include flipping the die 62 and the spacer 80 coupled to the clip 66 after they are bonded to the clip and coupling an adhesive, which may be any type of adhesive disclosed herein including a sintering material 92, over the die 62 and the spacer 80 coupled to the etched clip 66. The sintering material 92 may be applied using any technique disclosed herein.

Referring to FIG. 36, a side view of a sintering material coupled over a substrate is illustrated. In various implementations, an adhesive, which may be a sintering material 88, may also be applied over a substrate 90. Accordingly, the sintering material may be applied to both the substrate, the die, and the spacers. In other implementations, the sintering material is coupled either over the die and the spacers or over the substrate, but not over both. In implementations having the sintering material, the sintering material may be dried through the application of heat which may be any temperature disclosed herein.

Figure 37:
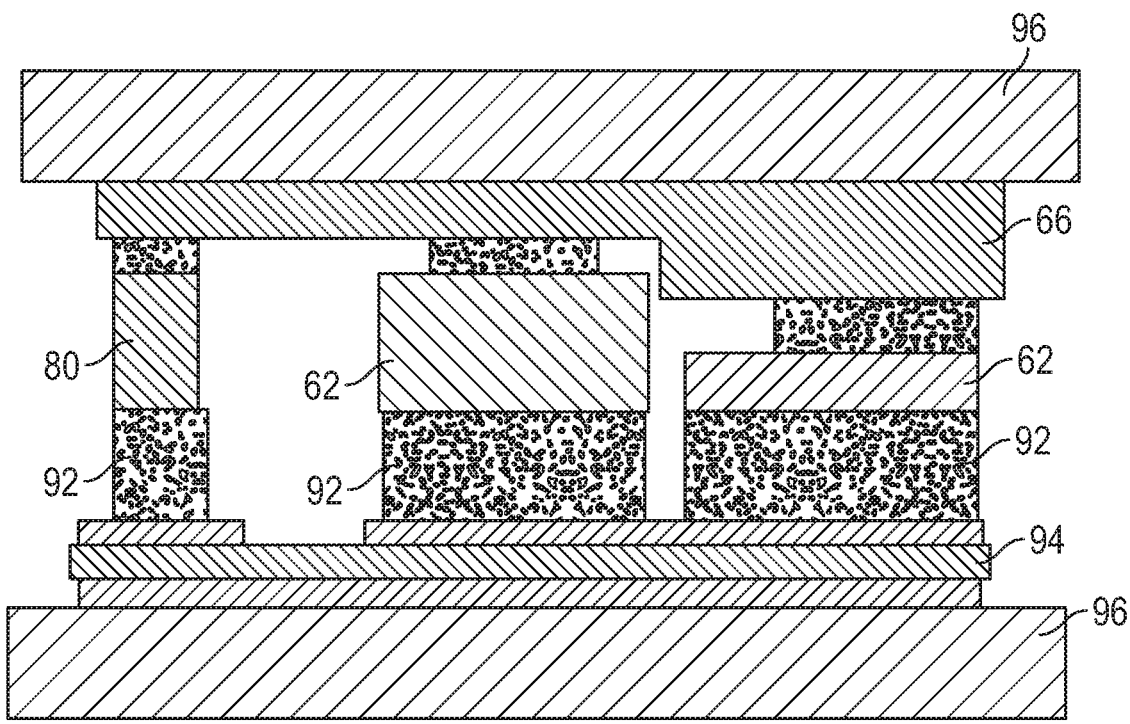
FIG. 37 is a side view of a substrate coupled to the plurality of die, spacer, and clip of FIG. 31 in a sintering tool.

Referring to FIG. 37, a side view of a substrate coupled to the plurality of die, spacer, and clip of FIG. 31 in a sintering tool is illustrated. The method of forming the semiconductor package includes coupling the die 62 and the spacer 80 over the substrate 94. In various implementations, the die 62 and the spacer 80 may be coupled to the substrate through a pressure sintering process by a sintering tool 96. The sintering process may be any type of sintering process disclosed herein.

Figure 38:
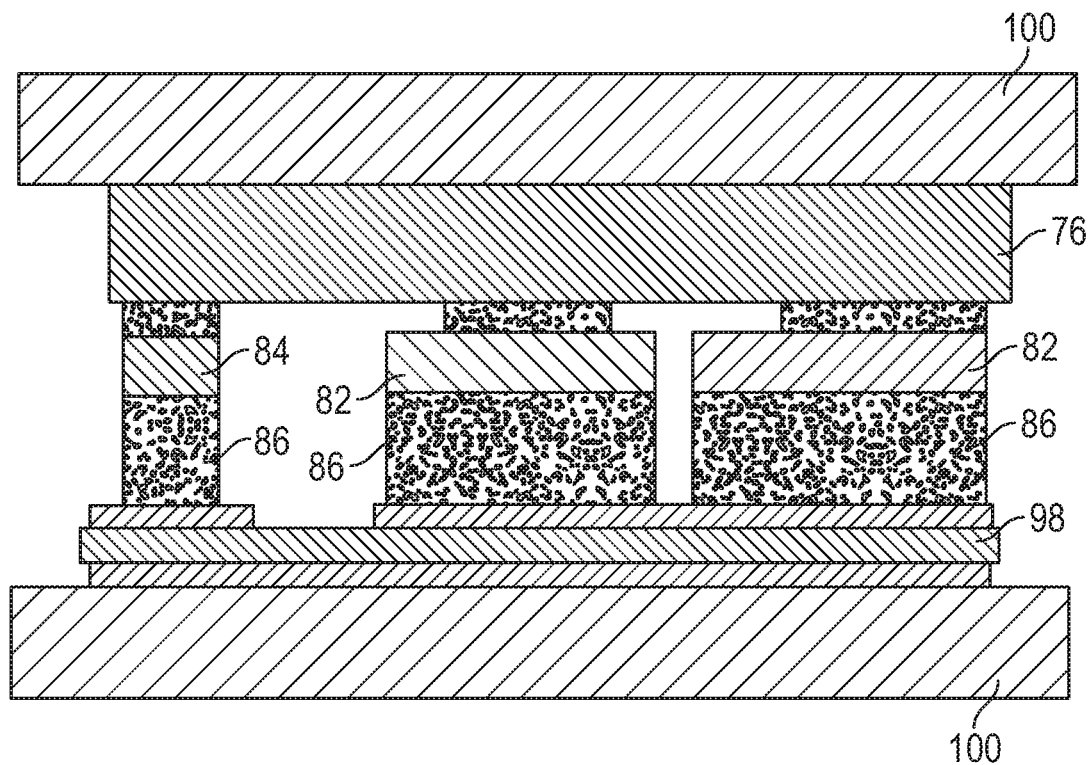
FIG. 38 is a side view of a substrate coupled to the plurality of die, spacer, and clip of FIG. 30 in a sintering tool.

Referring to FIG. 38, a side view of a substrate coupled to the plurality of die, spacer, and clip of FIG. 30 in a sintering tool is illustrated. The method of forming the semiconductor package includes coupling the die 82 and the spacer 84 over the substrate 98. In various implementations, the die 82 and the spacer 84 may be coupled to the substrate 98 through a pressure sintering process by a sintering tool 100. The sintering process may be any type of sintering process disclosed herein.

As illustrated by FIGS. 37 and 38, various implementations of a method of forming the semiconductor package may include flipping the die and spacers coupled to the clips after they die and spacers are bonded to the clips.

Figure 39:
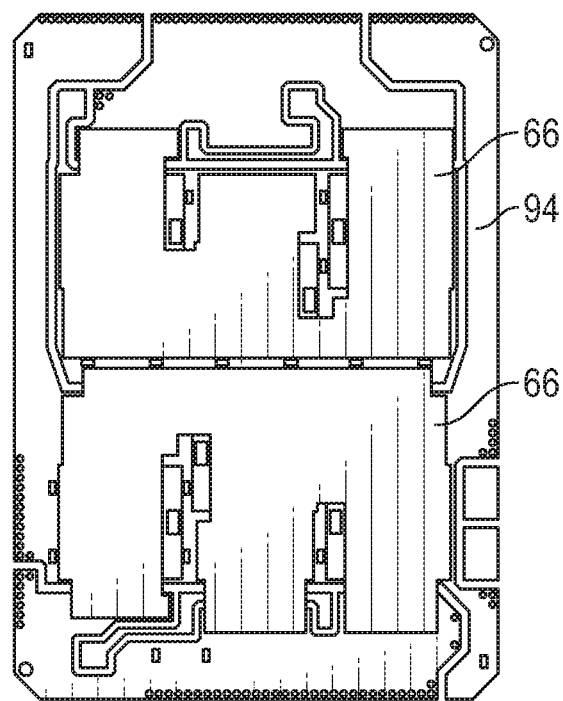
FIG. 39 is a top view of a clip coupled over the substrate after the sintering process.
Figure 40:
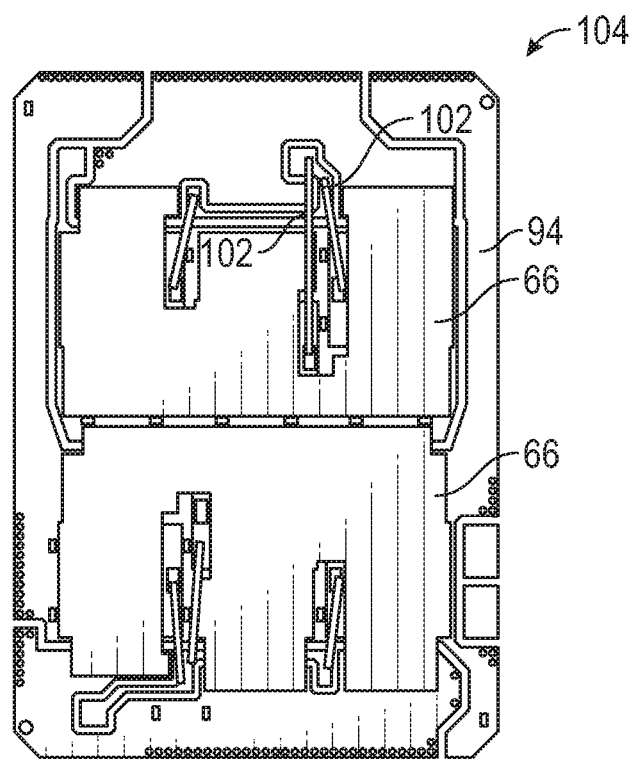
FIG. 40 is a top view of the semiconductor module.

Referring to FIG. 39, a top view of the clip bonded over the substrate after the sintering process is illustrated. Referring to FIG. 40, a top view of a semiconductor module is illustrated. The semiconductor module 104 of FIG. 40 may be the same as or similar to the semiconductor module 50 of FIG. 15. In various implementations, the method of forming the semiconductor package may include coupling electrical connectors 102 between select terminals of the die and substrate 94.

Any components or elements of the implementation of the semiconductor package of FIG. 15 or steps or processes of the method implementation of making the semiconductor package of FIG. 15 or module of FIG. 40 may be used in any other implementation disclosed herein.

Figure 41:
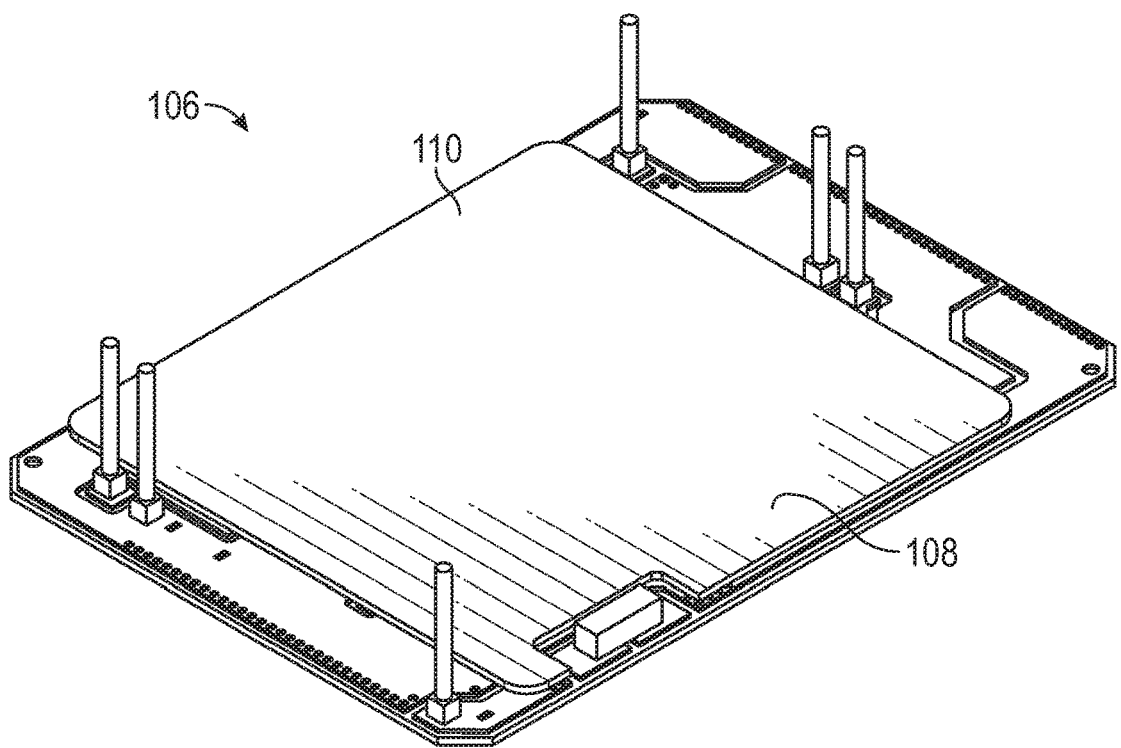
FIG. 41 is a top perspective view of a semiconductor module.

Referring to FIG. 41, a perspective view of a semiconductor module is illustrated. The semiconductor module 106 of FIG. 41 may be similar to the semiconductor module of FIG. 1, with the difference being that rather than clips, the semiconductor module 106 includes a redistribution layer (RDL) 108. In such implementations, the RDL 108 and spacer may form the interconnections between the modules and dies. The RDL also electrically connects the one or more die and the spacer. In such implementations, the module may include no wirebonds and no clips. The RDL 108 may include any type of metal, alloy thereof, combination thereof, or other conductive material and may have a pattern corresponding to the die and the spacers of the module. In particular implementations, the RDL 108 may include metallic electrical traces that may be plated/coated with silver, palladium, nickel, gold, or any other metal. The electrical traces may be on only a single side of the RDL. In various implementations, the RDL 108 may include an insulative layer 110. The insulative layer 110 may be coupled over the plurality of die and the spacer. The spacers may form an additional connection between the substrate and the RDL 108. In various implementations, the spacers are directly coupled to both the substrate and the RDL though any solder or adhesive disclosed herein, including silver sintering material. Rather than forming connections via the clips, the die and spacers may be coupled together through the RDL 108. The die and the spacers may be coupled to the RDL through an adhesive, such as a silver sintering material. In various implementations, the insulative layer 110 may include, by non-limiting example, boron nitrite, aluminum oxide, aluminum nitride, silicon nitride, molybdenum derivatives, graphene derivatives, or other insulative materials. In various implementations, the RDL's interconnection to the die may provide low on-state resistance (RDS) of the semiconductor module. The insulative layer 110 formed in or to the RDL 108 may also be able to fully utilize the die's top metallization. Further, the insulative layer 110 may reduce the risk of damage to the die as the force used to form the wirebond is eliminated with the insulative layer 110 included as part of the RDL 108. The RDL 108 having the insulative layer 110 may ultimately lead to improved power management, better thermal performance, and higher reliability. In various implementations, the insulative layer 110 may include one or more openings to give sufficient clearance the pins, thermistor, or any other device configured to be coupled to the module.

Figure 42:
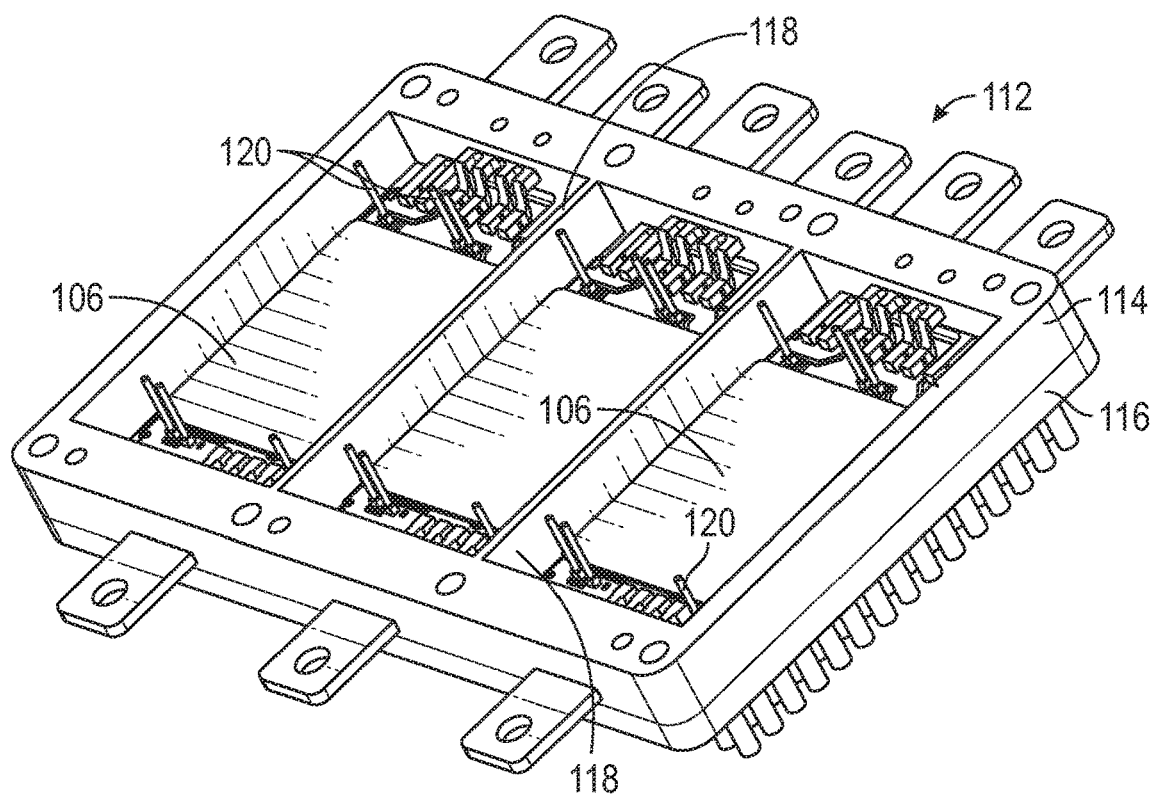
FIG. 42 is a top perspective view of a semiconductor package.
Figure 45:
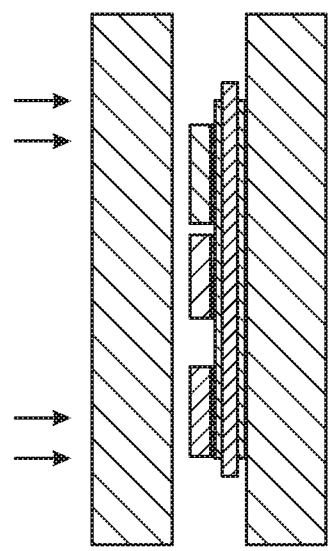
FIG. 45 is a side view of a plurality of die, a spacer and a substrate in a sintering tool.

Referring to FIG. 42, a top perspective view of a semiconductor package is illustrated. In various implementations, the semiconductor package 112 may include one or more of the semiconductor modules 106 illustrated by FIG. 41 coupled to a casing 114 and a back plate 116. In the implementation illustrated by FIG. 42, three modules are included in the semiconductor package. In various implementations, the casing 114 may include one or more struts 118 dividing the semiconductor modules 106. Though not illustrated, in various implementations the interior of the casing 114 may be filled with an encapsulant covering the semiconductor modules 106. The encapsulant may include a potting compound, and in particular implementations, may include a gel potting compound. In such implementations, the pins 120 may be exposed through the encapsulant.

Figure 44:
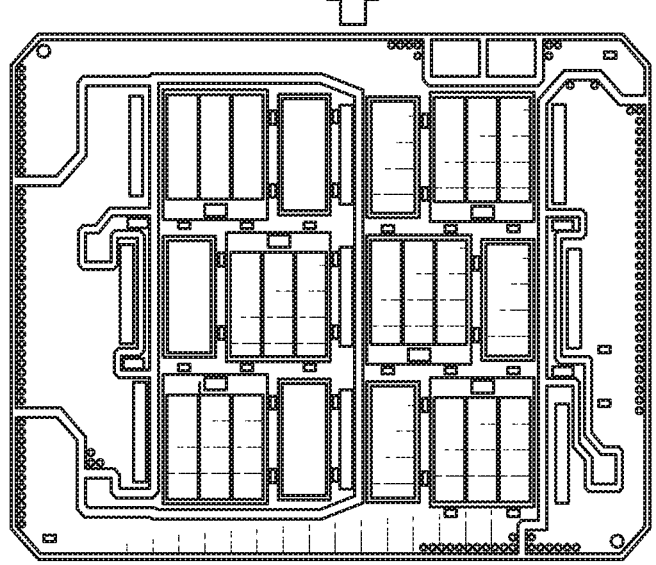
FIG. 44 is a top view of a plurality of die and spacers coupled over the substrate of FIG. 43.
Figure 43:
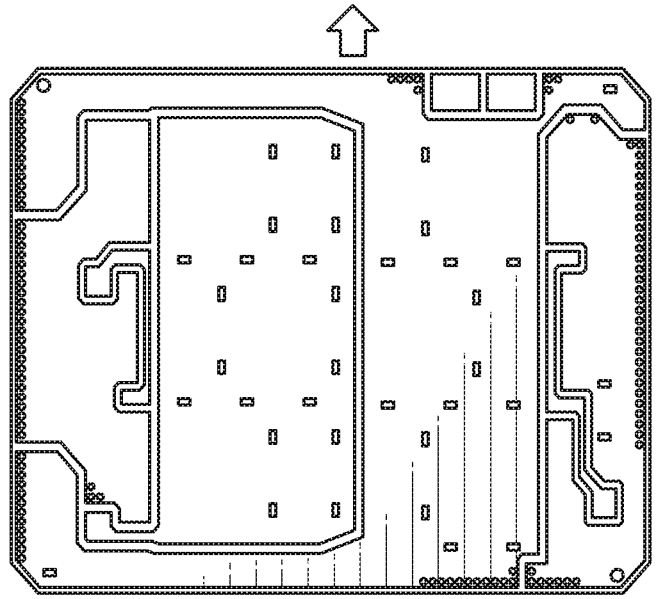
FIG. 43 is a is a top view of a substrate.

Referring to FIGS. 43-53, a method of forming a semiconductor package is illustrated. Referring to FIG. 43, a top view of a substrate is illustrated. Referring to FIG. 44, a top view of a plurality of die and spacers coupled over the substrate of FIG. 43 is illustrated, and referring to FIG. 45, a side view of a plurality of die and a spacer in a sintering tool is illustrated. In various implementations, the method illustrated by FIGS. 43-45 may be the similar to the method illustrated by FIGS. 3-5.

Figure 46:
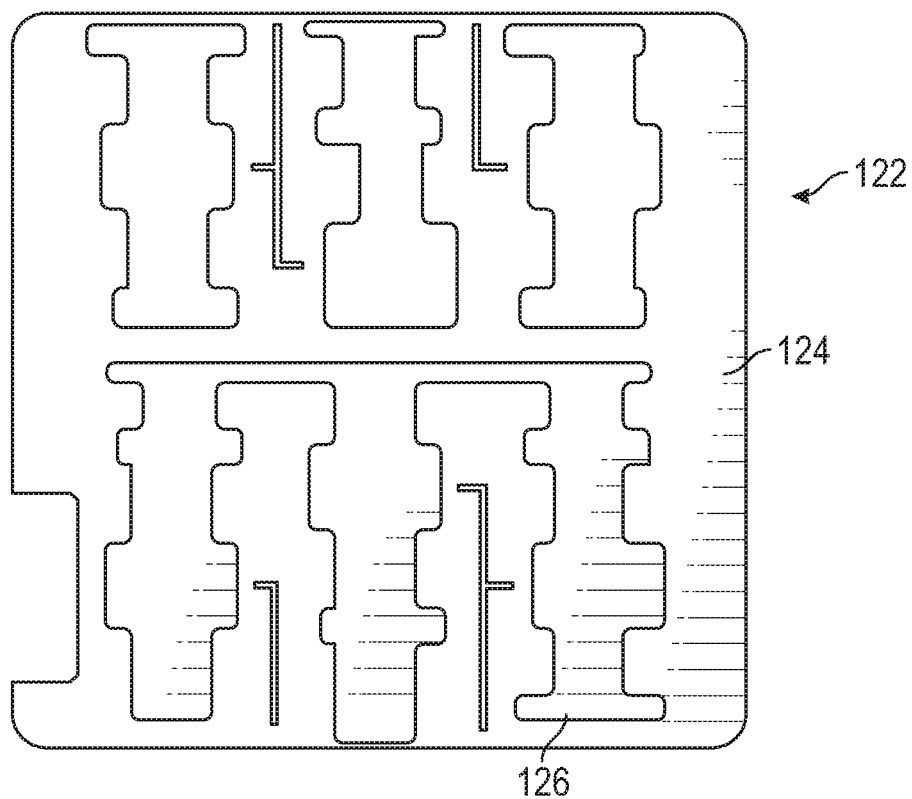
FIG. 46 is a bottom view of a redistribution layer.
Figure 47:
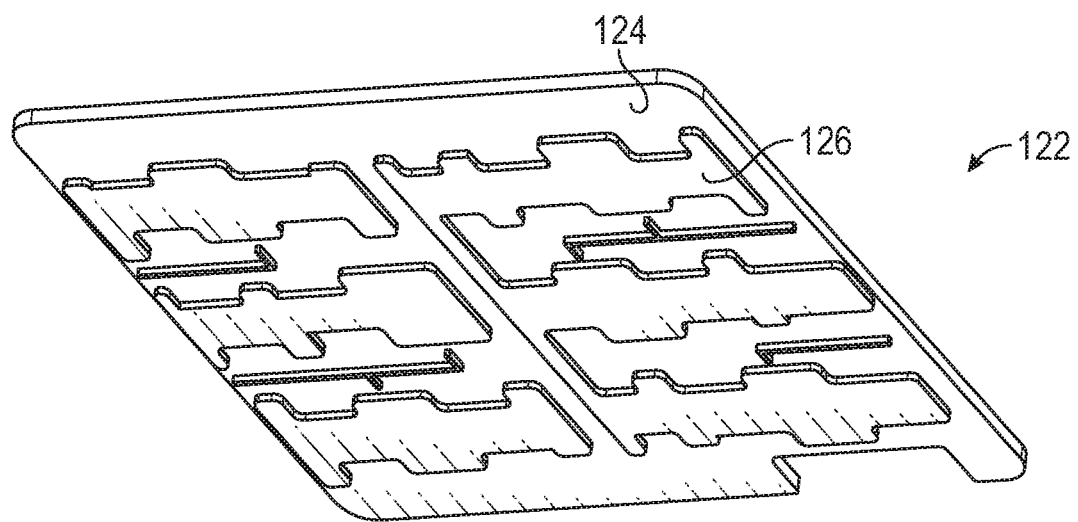
FIG. 47 is a bottom perspective view of the redistribution layer of FIG. 46.
Figure 48:
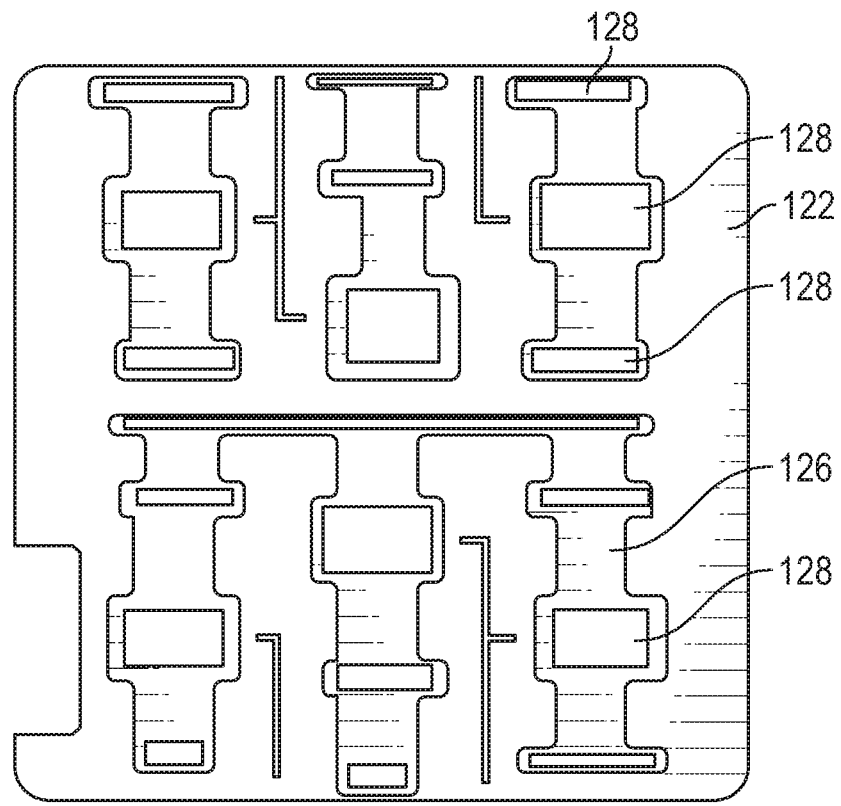
FIG. 48 is a bottom view of the redistribution layer of FIG. 46 having an sintering material coupled thereto.

Referring to FIG. 46, a bottom view of an RDL is illustrated, and referring to FIG. 47, a bottom perspective view of the RDL of FIG. 46 is illustrated. The RDL 122 may include may include any type of material disclosed herein. In various implementations, the RDL 122 may include an insulative layer 124 and conductive traces 126 coupled to or at least partially embedded within the insulative layer 124. The conductive traces 126 may include a pattern corresponding with the plurality of die and spacers to help accommodate maximum power transfer through the interconnection between the die and/or spacers and the RDL 122. Referring to FIG. 48, a bottom view of the insulative layer of FIG. 46 having a sintering material coupled to the RDL is illustrated. In various implementations, the method of forming the semiconductor package includes applying an adhesive to select portions of the RDL. In particular implementations, the adhesive may be a sintering material 128, including a silver sintering material. In such implementations, the sintering material 128 may be screen printed, film laminated, stencil printed or dispensed on the RDL 122 using any technique disclosed in this document.

Figure 49:
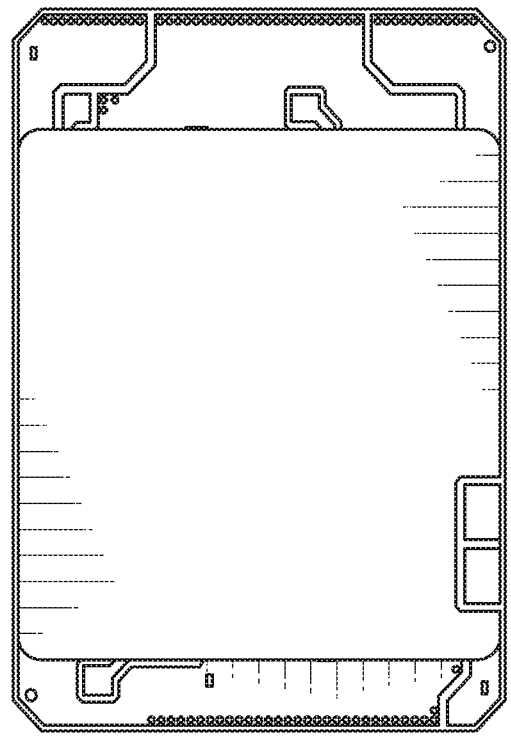
FIG. 49 is a top view of the redistribution layer coupled over the plurality of die and spacer.
Figure 50:
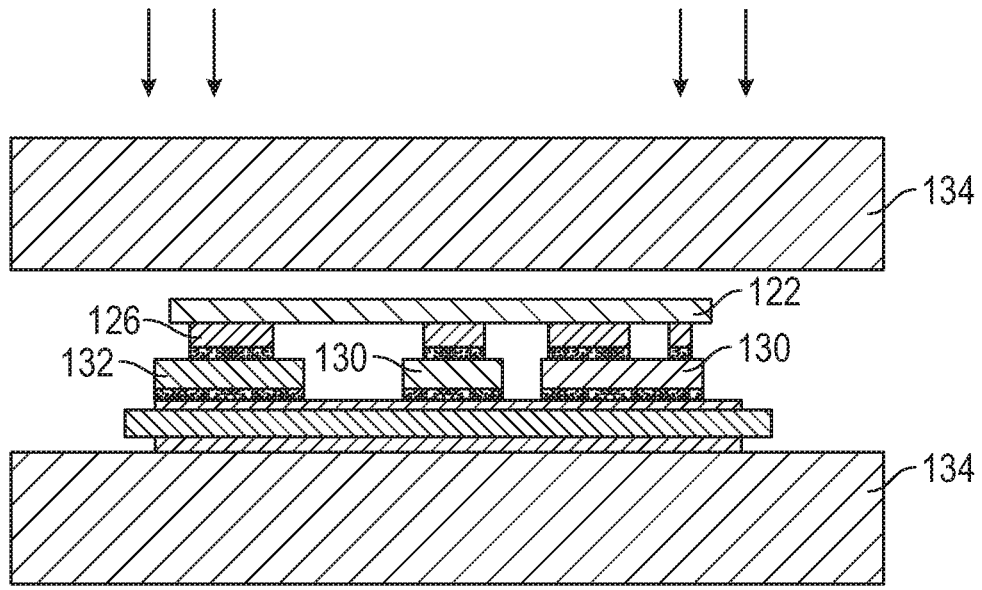
FIG. 50 is a side view of the redistribution layer, plurality of die, and spacer in a sintering tool.

Referring to FIG. 49, a top view of the RDL coupled over the plurality of die and the spacers is illustrated. In various implementations, the method of forming a semiconductor package includes coupling the RDL 122 over a plurality of die and spacers. After coupling the RDL 122 to the die and the spacers, as illustrated by FIG. 49, the method may include curing the sintering material. Referring to FIG. 50, a cross sectional side view of the RDL, die, and spacers of FIG. 49 in a sintering tool is illustrated. In various implementations, the method of forming the semiconductor package may include bonding the RDL 122 to the die 130 and spacers 132. The RDL 122 may be bonded to the die 130 and the spacers 132 through a pressure sintering process by the sintering tool 134, including any sintering or bonding process disclosed herein.

Figure 51:
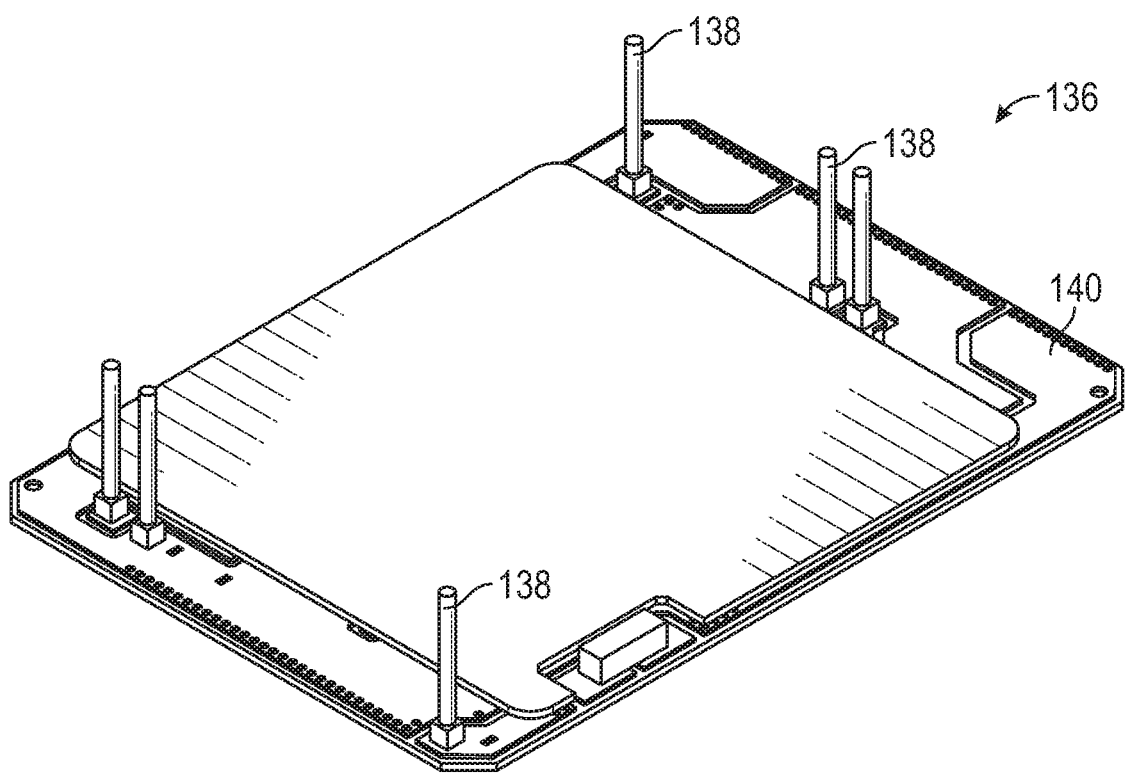
FIG. 51 is a top perspective view of the semiconductor module of FIG. 41.

Referring to FIG. 51, a top perspective view of a semiconductor module is illustrated. The semiconductor module 136 of FIG. 51 may be the same as or similar to the semiconductor module 106 of FIG. 41. In various implementations, the method of forming a semiconductor package may include coupling a plurality of pins 138 to the substrate 140. In such implementations, the pins 138 may be coupled to the substrate 140 through dispensing a soldering paste to the area of the substrate to be coupled to the pins. The pins 138 and any other elements (such as a thermistor) may be coupled to the solder paste and the solder paste may then be reflowed, bonding the pins 138 to the substrate 140. A guide jig may be used to hold the pins 138 in place during reflow of the soldering paste.

Figure 52:
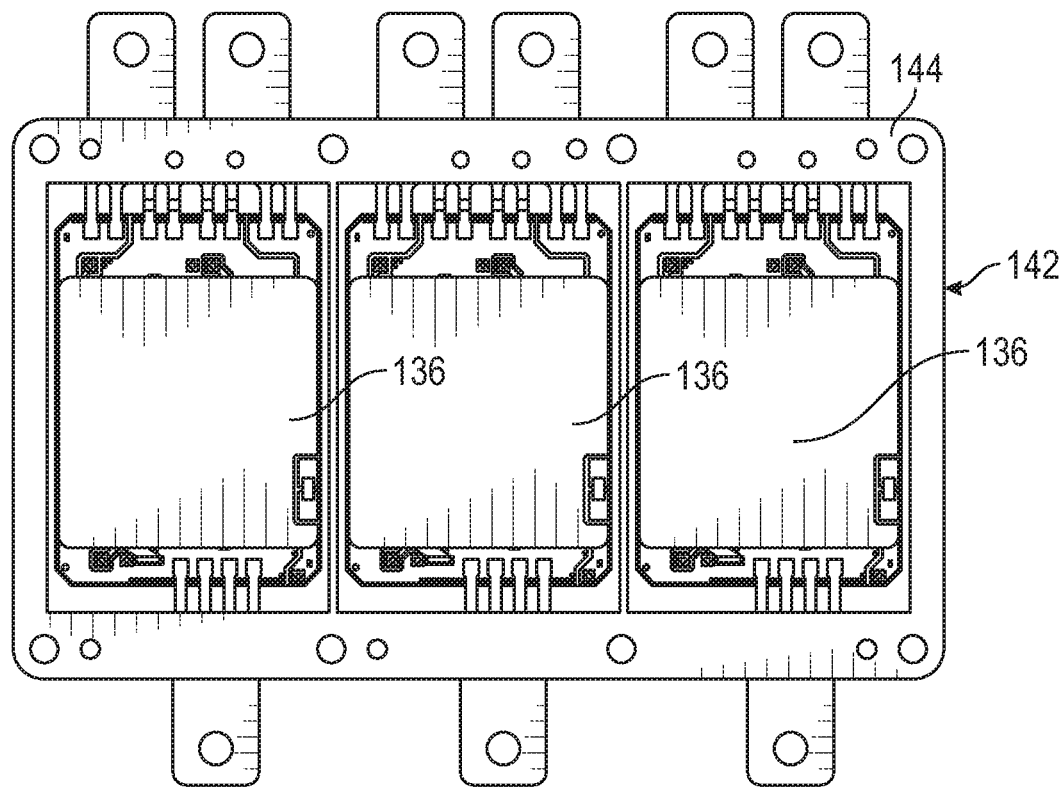
FIG. 52 is a top view of the semiconductor package of FIG. 42.
Figure 53:
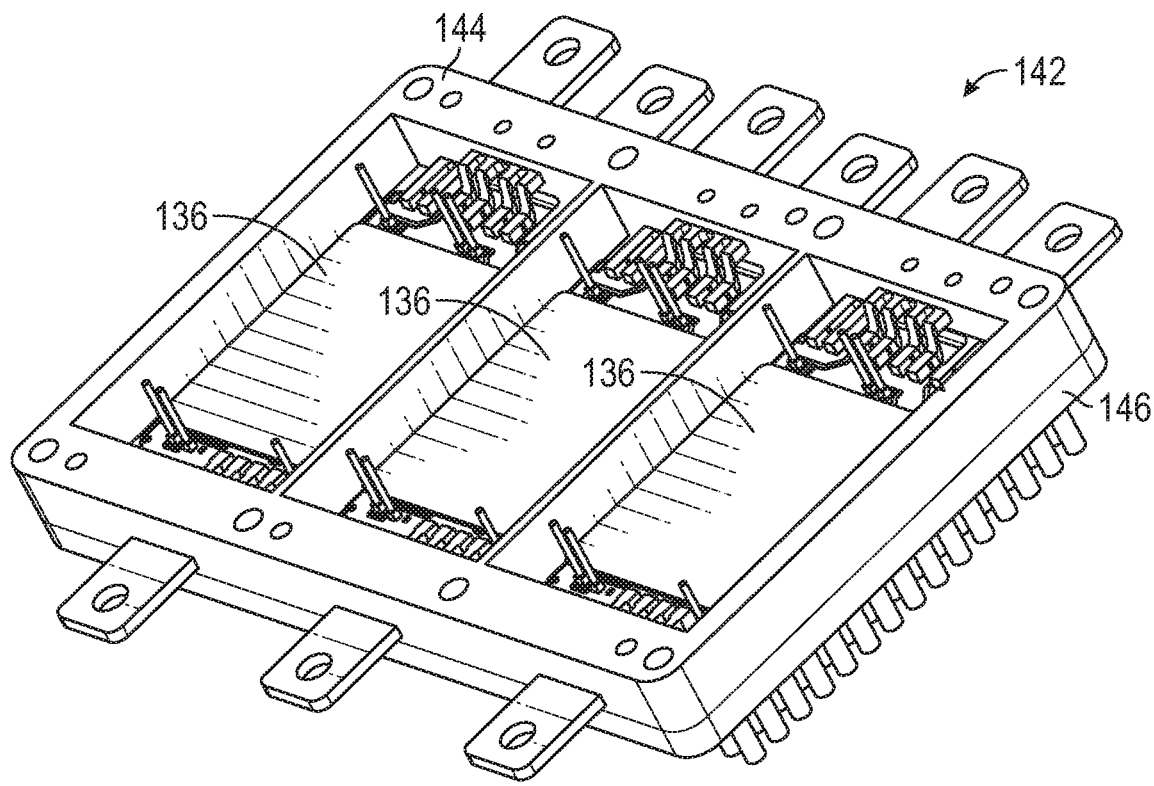
FIG. 53 is a top perspective view of the semiconductor package of FIG. 42.

Referring to FIG. 52, a top view of a semiconductor package is illustrated, and referring to FIG. 53, a top perspective view of the semiconductor package is illustrated. The semiconductor package 142 may be the same as or similar to the semiconductor package of FIG. 42. In various implementations, the method of forming the semiconductor package may include coupling a casing 144 over one or more semiconductor modules 136. While the semiconductor package of FIG. 52 is illustrated as including three semiconductor modules, other semiconductor packages may include more or less modules, including, only one module, two modules, four modules, or more than four modules. The method of forming the semiconductor package 142 may also include coupling the semiconductor package to a back plate 146. Though not illustrated, the method may also include applying any type of encapsulant disclosed herein within the casing 144 and over the semiconductor modules 136.

Any components or elements of the implementation of the semiconductor package of FIG. 42 or method steps of implementations of the method of making the semiconductor package of FIGS. 52-53 may be used in any other implementation disclosed herein.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package comprising:
a first die coupled over a substrate;
a second die coupled over the substrate;
an electrically conductive spacer coupled over the substrate; and
a clip coupled over and directly to the first die, the second die, and the electrically conductive spacer through one of a conductive adhesive or a solder;
wherein the clip electrically couples the first die and the second die with the electrically conductive spacer;
wherein the clip comprises a first portion with a first thickness and a second portion with a second thickness less than the first thickness; and
wherein the first portion is directly coupled over the first die and the second portion is directly coupled over the second die and the electrically conductive spacer.

2. The package of claim 1, wherein the electrically conductive spacer is a vertical connection system.

3. The package of claim 1, wherein the clip is coupled to the first die, the second die, and the electrically conductive spacer through a silver sintering material.

4. The package of claim 1, wherein the first die and the second die comprise an insulative gate bipolar transistor (IGBT) and a diode.

5. The package of claim 1, wherein the electrically conductive spacer comprises a copper foil.

6. The package of claim 1, wherein the package includes only a single clip.

7. The package of claim 1, wherein the electrically conductive spacer is directly coupled to both the substrate and the clip through one of the solder, or the conductive adhesive and wherein the first die and the second die are directly coupled to both the substrate and the clip through a sintering material.

8. The package of claim 1, wherein a thickness of the first die is greater than a thickness of the second die.

9. The package of claim 1, wherein a plane formed by a surface of the first portion facing the first die is closer to the substrate than a plane formed by a surface of the second die facing the clip.

10. A semiconductor package comprising:
one or more die coupled over a substrate;
an electrically conductive spacer coupled over the substrate; and
a redistribution layer (RDL) comprising boron nitride coupled over and directly to the one or more die and the electrically conductive spacer through one of a conductive adhesive or a solder;
wherein the RDL electrically connects the one or more die and the electrically conductive spacer; and
wherein a height of the electrically conductive spacer is the same as a height of a die of the one or more die.

11. The package of claim 10, wherein the electrically conductive spacer is directly coupled to both the substrate and the RDL through a silver sinter material.

12. The package of claim 10, wherein the RDL comprises a plurality of electrical traces on one side.

13. The package of claim 10, wherein the electrically conductive spacer comprises copper foil.

14. The package of claim 10, wherein the substrate comprises a direct bonded copper (DBC) substrate.

15. The package of claim 10, wherein the one or more die comprise a first die and a second die, wherein the height of the electrically conductive spacer is the same as a height of the first die and is the same as a height of the second die.

16. A semiconductor package comprising:
a plurality of semiconductor modules, each module comprising:
   a first die coupled over a substrate;
   a second die coupled over a substrate;
   an electrically conductive spacer coupled over the substrate; and
   a clip coupled over and directly to the first die, the second die, and the electrically conductive spacer through one of a conductive adhesive or a solder;
wherein the clip electrically couples the first die and the second die with and the electrically conductive spacer;
wherein the clip comprises a first portion with a first thickness and a second portion with a second thickness less than the first thickness; and
wherein a thickness of the first die is greater than a thickness of the second die and the thickness of the second die is the same as a thickness of the electrically conductive spacer.

17. The package of claim 16, wherein the first portion is directly coupled over the first die and the second portion is directly coupled over the electrically conductive spacer and the second die.

18. The package of claim 16, wherein the plurality of modules comprises six modules.

19. The package of claim 16, wherein the electrically conductive spacer is directly coupled to both the substrate and the clip through one of the solder, or the conductive adhesive and wherein the first die and the second die are directly coupled to both the substrate and the clip through a sintering material.

* * * * *